(12) United States Patent
Chiang et al.

(10) Patent No.: US 10,319,692 B2
(45) Date of Patent: Jun. 11, 2019

(54) SEMICONDUCTOR STRUCTURE AND MANUFACTURING METHOD THEREOF

(71) Applicant: TAIWAN SEMICONDUCTOR MANUFACTURING COMPANY LTD., Hsinchu (TW)

(72) Inventors: Yung-Ping Chiang, Hsinchu County (TW); Chao-Wen Shih, Hsinchu County (TW); Hao-Yi Tsai, Hsinchu (TW); Mirng-Ji Lii, Hsinchu County (TW)

(73) Assignee: Taiwan Semiconductor Manufacturing Company Ltd., Hsinchu (TW)

( * ) Notice: Subject to any disclaimer, the term of this patent is extended or adjusted under 35 U.S.C. 154(b) by 10 days.

(21) Appl. No.: 15/385,100

(22) Filed: Dec. 20, 2016

(65) Prior Publication Data

US 2017/0103955 A1    Apr. 13, 2017

Related U.S. Application Data

(62) Division of application No. 14/504,053, filed on Oct. 1, 2014, now Pat. No. 9,543,259.

(51) Int. Cl.
*H01L 21/44* (2006.01)
*H01L 23/00* (2006.01)
(Continued)

(52) U.S. Cl.
CPC ........ *H01L 24/02* (2013.01); *H01L 21/31053* (2013.01); *H01L 21/56* (2013.01); *H01L 22/12* (2013.01); *H01L 23/3157* (2013.01); *H01L 23/3171* (2013.01); *H01L 24/03* (2013.01);

*H01L 24/05* (2013.01); *H01L 24/11* (2013.01); *H01L 24/13* (2013.01); *H01L 24/14* (2013.01); *H01L 24/16* (2013.01); *H01L 23/3192* (2013.01); *H01L 23/562* (2013.01); *H01L 2224/0219* (2013.01); *H01L 2224/0235* (2013.01); *H01L 2224/0239* (2013.01); (Continued)

(58) Field of Classification Search
CPC . H01L 24/02; H01L 24/024; H01L 24/02418; H01L 22/12; H01L 24/04; H01L 24/05; H01L 24/13; H01L 24/11; H01L 24/16; H01L 24/18; H01L 257/781; H01L 257/786; H01L 257/735–257/738
USPC .......... 257/781, 786, 735–738; 438/612–614
See application file for complete search history.

(56) References Cited

U.S. PATENT DOCUMENTS

| 5,903,428 | A | * | 5/1999 | Grimard | ............. | H01L 21/6833 |
|---|---|---|---|---|---|---|
| | | | | | | 279/128 |
| 2006/0027936 | A1 | * | 2/2006 | Mizukoshi | ............ | H01L 21/563 |
| | | | | | | 257/781 |

(Continued)

*Primary Examiner* — Herve-Louis Y Assouman
*Assistant Examiner* — Herve Assouman
(74) *Attorney, Agent, or Firm* — Juan Carlos A. Marquez; Marquez IP Law Office, PLLC

(57) ABSTRACT

A method for manufacturing a semiconductor structure includes: receiving a semiconductive substrate with a post passivation interconnect including an oval landing area; forming a first conductor on the oval landing area; forming a polymer layer above the semiconductive substrate, thereby surrounding a portion of the first conductor; polishing the polymer layer and the first conductor in order to form a planarized surface; and forming a second conductor on the polished first conductor.

20 Claims, 29 Drawing Sheets

(51) Int. Cl.
H01L 23/31 (2006.01)
H01L 21/3105 (2006.01)
H01L 21/56 (2006.01)
H01L 21/66 (2006.01)

(52) U.S. Cl.
CPC .............. *H01L 2224/02181* (2013.01); *H01L 2224/02311* (2013.01); *H01L 2224/02313* (2013.01); *H01L 2224/02331* (2013.01); *H01L 2224/02375* (2013.01); *H01L 2224/039* (2013.01); *H01L 2224/0332* (2013.01); *H01L 2224/0384* (2013.01); *H01L 2224/0391* (2013.01); *H01L 2224/03334* (2013.01); *H01L 2224/03462* (2013.01); *H01L 2224/0401* (2013.01); *H01L 2224/056* (2013.01); *H01L 2224/05008* (2013.01); *H01L 2224/05025* (2013.01); *H01L 2224/05124* (2013.01); *H01L 2224/05139* (2013.01); *H01L 2224/05144* (2013.01); *H01L 2224/05147* (2013.01); *H01L 2224/05155* (2013.01); *H01L 2224/05184* (2013.01); *H01L 2224/05569* (2013.01); *H01L 2224/10126* (2013.01); *H01L 2224/119* (2013.01); *H01L 2224/11462* (2013.01); *H01L 2224/11602* (2013.01); *H01L 2224/11849* (2013.01); *H01L 2224/131* (2013.01); *H01L 2224/13014* (2013.01); *H01L 2224/13022* (2013.01); *H01L 2224/13024* (2013.01); *H01L 2224/13082* (2013.01); *H01L 2224/13116* (2013.01); *H01L 2224/13118* (2013.01); *H01L 2224/13124* (2013.01); *H01L 2224/13144* (2013.01); *H01L 2224/13147* (2013.01); *H01L 2224/1412* (2013.01); *H01L 2224/16227* (2013.01); *H01L 2224/16238* (2013.01); *H01L 2224/92* (2013.01); *H01L 2924/01013* (2013.01); *H01L 2924/01022* (2013.01); *H01L 2924/01028* (2013.01); *H01L 2924/01029* (2013.01); *H01L 2924/01047* (2013.01); *H01L 2924/01073* (2013.01); *H01L 2924/01074* (2013.01); *H01L 2924/01079* (2013.01); *H01L 2924/0496* (2013.01); *H01L 2924/04941* (2013.01); *H01L 2924/04953* (2013.01); *H01L 2924/3511* (2013.01); *H01L 2924/3512* (2013.01)

(56) References Cited

U.S. PATENT DOCUMENTS

| | | | |
|---|---|---|---|
| 2007/0202630 A1* | 8/2007 | Kurata | H01L 21/561 438/106 |
| 2008/0283998 A1* | 11/2008 | Choi | H01L 23/49838 257/692 |
| 2009/0115058 A1* | 5/2009 | Yu | H01L 24/11 257/738 |
| 2012/0306070 A1* | 12/2012 | Yew | H01L 24/05 257/737 |
| 2012/0329263 A1* | 12/2012 | Chou | H01L 24/05 438/612 |

\* cited by examiner

SEMICONDUCTOR STRUCTURE AND MANUFACTURING METHOD THEREOF

CROSS REFERENCE TO RELATED APPLICATIONS

This application is a divisional of application Ser. No. 14/504,053, filed on Oct. 1, 2014, which is incorporated by reference in its entirety.

BACKGROUND

Presently, electronic equipment is essential for many modern applications. Therefore, consumers are increasingly demanding more processing power, lower electrical power usage and cheaper devices. As the electronic industry strives to meet these demands and more complicated and denser configurations, miniaturization will result in an extension of the number of chips per wafer and the number of transistors per chip, as well as a reduction in power usage. Wafer level packaging (WLP) technology has been gaining popularity since the electronic components are being designed to be lighter, smaller, more multifunctional, more powerful, more reliable and less expensive. The WLP technology combines dies having different functionalities at a wafer level, and is widely applied in order to meet continuous demands toward the miniaturization and higher functions of the electronic components.

A large substrate in WLP technology raises concerns about bump connections, especially at the peripheral region of such substrate. In contrast to a traditional packaging technology, the WLP technology is crafted on a greater scale and in a more complicated working environment. Some factors may lead to warpage of the substrate, thereby failing to achieve bump connections between the substrate and a board connected therewith. Since the bump connections in the WLP technology is poorly controlled, improvements in the method for a WLP continue to be sought.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

A more complete understanding of the present disclosure may be derived by referring to the detailed description and claims when considered in connection with the Figures, where like reference numbers refer to similar elements throughout the Figures, and:

DETAILED DESCRIPTION

Figure 1:
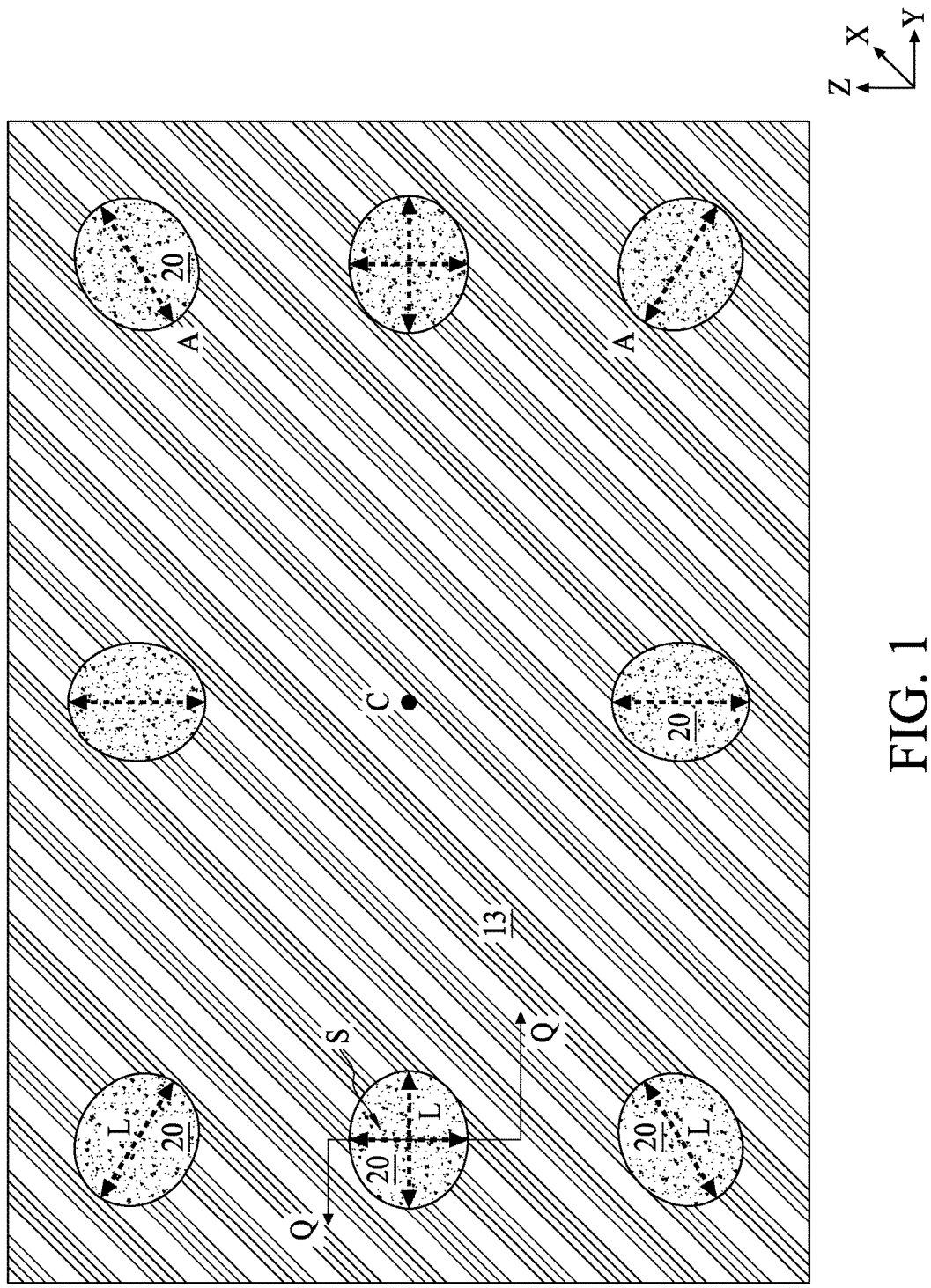
FIG. 1 is a top view of a semiconductor structure according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In the present disclosure, extending a landing area for receiving a conductive bump enables an improvement of the bump connection. Several landing areas are designed to be in an oval shape with a longest axis and a shortest axis. As the landing areas extend, the conducting bumps also extend along the longest axis. Even when the substrate is warped during fabrication, the extended bumps are able to maintain an electric connection to a printed circuit board (PCB). Thus, the bump connection between the PCB and the substrate is improved.

In various embodiments, the oval-shaped bump attributed from the landing area has a longest axis and hence, it is difficult to completely crack the oval-shaped bump along the longest axis. Substrate warpage usually occurs during thermal fabrication and generates internal stress, which causes the bump to be cracked. Once the bump is completely cracked, the bump is separated into two parts, both of which are electrically disconnected with each other. Since the oval-shaped bump includes a longest axis, which is longer than an axis of the original bump, the complete cracking rarely occurs at the oval-shaped bump. Thus, the oval-shaped bump is capable of improving the bump connection between the PCB and the substrate.

As used herein, a "substrate" refers to a bulk substrate on which various layers and device structure are formed. In some embodiments, the bulk substrate includes silicon or a compound semiconductor, such as GaAs, InP, Si/Ge, or SiC. Examples of the layers include dielectric layers, doped layers, polysilicon layers or conductive layers. Examples of the device structures include transistors, resistors, and/or capacitors, which may be interconnected through an interconnect layer to additionally integrated circuits. In some embodiments, the bulk substrate includes a wafer such as a polished wafer, an epi wafer, an argon anneal wafer, a hai wafer and a silicon on insulator (SOI) wafer.

As used herein, "deposition" refers to operations of depositing materials on a substrate using a vapor phase of a material to be deposited, a precursor of the material, an electrochemical reaction, or sputtering/reactive sputtering. Depositions using a vapor phase of a material include any operations such as, but not limited to, chemical vapor deposition (CVD) and physical vapor deposition (PVD). Examples of vapor deposition methods include hot filament CVD, rf-CVD, laser CVD (LCVD), conformal diamond coating operations, metal-organic CVD (MOCVD), thermal evaporation PVD, ionized metal PVD (IMPVD), electron beam PVD (EBPVD), reactive PVD, atomic layer deposition (ALD), plasma enhanced CVD (PECVD), high density plasma CVD (HDPCVD), low pressure CVD (LPCVD), and the like. Examples of deposition using electrochemical reaction include electroplating, electro-less plating, and the like. Other examples of deposition include pulse laser deposition (PLD), and atomic layer deposition (ALD).

As used herein, a "mask layer" recited in the present disclosure is an object of a patterning operation. The patterning operation includes various steps and operations and varies in accordance with features of embodiments. In some embodiments, a patterning operation patterns an existing film or layer. The patterning operation includes forming a mask on the existing film or layer and removing the unmasked portion of the film or layer with an etch or other removal operations. The mask layer is a photo resist or a hardmask. In some embodiments, a patterning operation directly forms a patterned layer on a surface. The patterning operation includes forming a photosensitive film on the surface, conducting a photolithography operation and a developing operation. The remaining photosensitive film may be removed or retained and integrated into the package.

Referring to FIG. 1, a top view of a semiconductor structure 10, which is adopted in various applications, is depicted. In some embodiments, the semiconductor structure 10 includes several conductors 20, which are surrounded by a polymer layer 13. In certain embodiments, these conductors 20 are in oval shapes. In other words, each of the conductors 20 includes a longest axis L and a shortest axis S, which is perpendicular to the longest axis L. In other embodiments, the longest axis L of the conductor 20 is toward a geometric center C of a semiconductive substrate (not shown) underneath polymer layer 13. Once the semiconductor structure 10 is warped, the degree of displacement maximizes at a peripheral region of the semiconductor structure 10 and along a radial direction from the geometric center C. Since the conductors 20 are arranged to have the longest axis L toward the geometric center C, the complete cracking due to the displacement rarely happens to the conductors 20.

Figure 2:
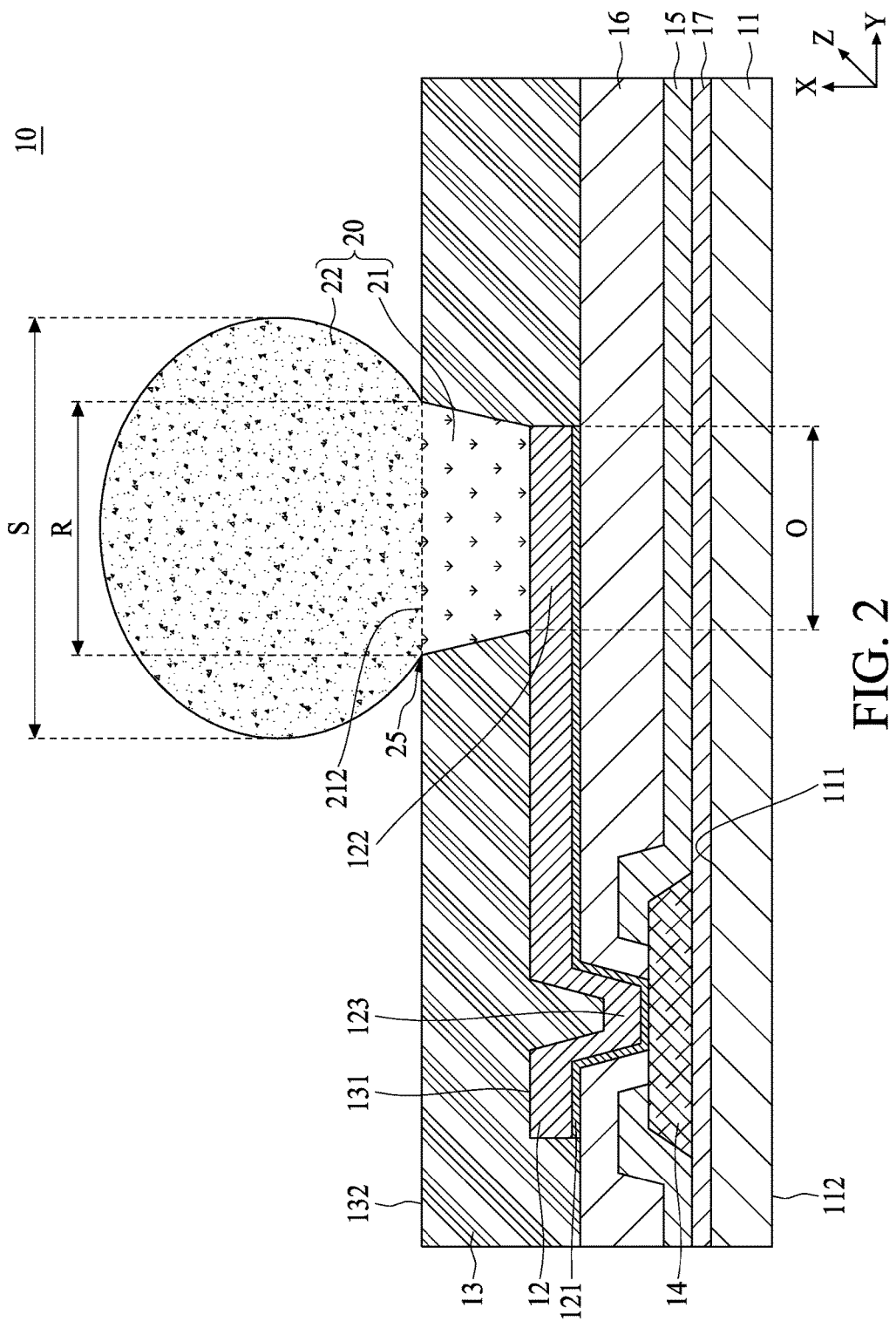
FIG. 2 is a cross-sectional view of a semiconductor structure according to some embodiments of the present disclosure.

Referring to FIG. 2, a cross-sectional view along line QQ in FIG. 1 is depicted. The semiconductor structure 10 includes a semiconductive substrate 11, a post passivation interconnect (PPI) 12, a polymer layer 13, a metal pad 14, a passivation layer 15, a dielectric layer 16, an active region 17, and the conductor 20. A surface 111 is the frontside surface of the semiconductive substrate 11 and is opposite to a backside surface 112 of the semiconductive substrate 11. In some embodiments, the semiconductive substrate 11 is, for example, bulk silicon, doped silicon or undoped silicon. In certain embodiments, the surface 112 is processed in subsequent back-end manufacturing operations such as backside thinning.

In some embodiments, the active region 17 includes interconnections, interlayer dielectric, and/or intermetal dielectric. In some embodiments, the active region 17 is fabricated to become integrated circuits (IC) in subsequent manufacturing operations.

In some embodiments, the metal pad 14 is formed on the active region 17 and over the surface 111 of the semiconductive substrate 11. The metal pad 14 includes aluminum, copper, silver, gold, nickel, tungsten, alloys thereof, and/or multi-layers thereof. The metal pad 14 is electrically coupled to the active region 17, for example, through underlying conductive traces or features.

Passivation layer 15 is formed on the metal pad 14. In certain embodiments, the passivation layer 15 is formed of dielectric materials such as silicon oxide, silicon nitride, or multi-layers thereof. The dielectric layer 16 is over the passivation layer 15 and covers a portion of the metal pad 14. Both the passivation 15 and the dielectric layer 16 are patterned in order to have a recess to expose a portion of the metal pad 14. The exposed metal pad 14 serves as an electrical contact between the active region 17 and other conductive trace external to the active region 17, for example, the PPI 12. In certain embodiments, the dielectric layer 16 is formed of a polymeric material such as epoxy, polyimide, benzocyclobutene (BCB), polybenzoxazole (PBO), and the like.

The PPI 12 includes a first portion 122 on the dielectric layer 16 and a second portion 123 extending into the recess of the passivation layer 15 and the dielectric layer 16. The second portion 123 of the PPI 12 may line the bottom and sidewalls of the recess and electrically couple to the metal pad 14. The PPI 12 may include conductive material such as gold, silver, copper, nickel, tungsten, aluminum, and/or alloys thereof.

In some embodiments, the first portion 122 of the PPI 12 is located at one terminal of the PPI 12 and acts as a landing area for receiving the conductor 20. In order to improve the reliability, the first portion 122 of the PPI 12 is designed in an oval shape. Similar to the conductors 20 in FIG. 1, the first portion 122 also has a longest axis toward the geometric center C. The first portion 21 of the conductor 20 is in contact with the PPI 12 and connecting with the second portion 22 of the conductor 20. Dotted line 212 represents an interface where the first portion 21 and second portion 22 meet. The geometric feature of the interface 212 is substantially attributed from the geometric feature of the PPI's first portion 122. For example, if the first portion 122 is in circular shape, the projective area of interface 212 is also in circular shape. If the first portion 122 is in oval shape, the projective area interface 212 is also in oval shape, such that the aspect ratio (shortest axis to longest axis) of the interface 212 is substantially equal to that of the first portion 122.

In some embodiments, the aspect ratio of PPI's first portion 122 is from about 0.65 to about 0.78. In certain embodiments, the aspect ratio of the first portion 122 is from about 0.69 to about 0.87. In other embodiments, the aspect ratio of the first portion 122 is from about 0.71 to about 0.85. In some other embodiments, the aspect ratio of the first portion 122 is from about 0.74 to about 0.89.

Though the geometric feature of interface 212 is substantially attributed from the first portion 122, the size can be different. For example, if the geometric feature is in circular shape, diameter may differ between the interface 212 and the first portion 122. For some oval shape examples illustrated in FIG. 2, the projective area of the interface 212 and the landing area 122 of the PPI 12 respectively include a shortest axis R and O. The shortest axis O of the landing area 122 is between about 0.7 and about 1.0 times of the length of the shortest axis R of the interface 212. In certain embodiments, the shortest axis O of the landing area 122 is between about 0.73 and about 0.95 times of the length of the shortest axis R of the interface 212. In other embodiments, the shortest axis O of the landing area 122 is between about 0.84 and about 0.98 times of the length of the shortest axis R of the interface 212. In some other embodiments, the shortest axis O of the landing area 12 is between about 0.78 and about 0.92 times of the length of the shortest axis R of the interface 212.

A layer 121 can be optionally chosen and designed to lie under the PPI 122. The layer 121 can be a single or multiple layer film, which includes some liners such as barrier or seed layer provided for PPI 122 landing. In some embodiments, layer 121 is relatively thin in view of the PPI 122 and may be ignored in some illustrative drawings in the present disclosure. In certain embodiments, layer 121 includes conductive materials such as Ti, TiN, Ta, TaN, W and WN.

The polymer layer 13 covers a portion of the PPI 12 and partially surrounds the conductor 20. One benefit to introduce the polymer layer 13 is to provide protection for the PPI 12 so as to isolate moisture and environmental disturbance from the conductive PPI material. Another benefit is to secure the conductor 20 at a predetermined position, for example the landing area 122 of the PPI 12, to prevent conductor 20 from dislocating under an undesired pulling force. In some embodiments, the polymer layer 13 is a molding compound and can include a single layer film or a composite stack. The molding compound includes various materials, for example, one or more of epoxy resins, phenolic hardeners, silicas, catalysts, pigments, mold release agents, and the like. Each of the materials for forming the molding compound has a high thermal conductivity, a low moisture absorption rate, a high flexural strength at board-mounting temperatures, or a combination thereof.

As aforementioned, the conductor 20 has two portions; the first portion 21 is substantially surrounded by the polymer layer 13 and the second portion 22 is substantially free from contacting with the polymer layer 13. In some embodiments, as illustrated in FIG. 2, the first portion 21 is viewed as a neck of the conductor 20 to support the head-like second portion 22. The location 25 where the interface 212 intersects with the polymer layer 13 can be viewed as a turning point of the conductor 20. In other words, the conductor 20 is necking at turning point 25.

In some embodiments, the absolute value of the curvature of the second portion 22 is greater than the curvature of the first portion 21. The sidewall of the conductor 20 may possess a first curvature and starts changing at the turning point 25. For example, the sidewall of the first portion 21 may be a substantially flat plane, which has a curvature approximately to 0. The sidewall of the second portion 22 is a curved surface, which possesses a curvature with absolute value greater than 0.

In some embodiments, the conductor 20 is made of a solder material or a metallic material including copper, aluminum, zinc, gold, lead or similar materials. In certain embodiments, the conductor 20 is a metal pillar formed on the first portion 122 of the PPI 12 and the metal pillar is made of a metallic material including copper, aluminum, zinc, gold, lead or similar materials.

In some embodiments, the conductor 20 is configured for electrically connecting the PPI 122 to an external electronic device. As in FIG. 3, the conductor 20 has one end connected with a conductive feature 31 of an electronic device 30. The electronic device 30 may be a printed circuit board (PCB), a semiconductor chip, or other suitable structure. Comparing FIG. 2, the shape of the conductor 20 in FIG. 3 may be altered after connecting with the external electronic device 30 because the morphology of the second portion 22 of the conductor 20 is deformed during the bonding operation. However, since the first portion 21 of the conductor 20 is secured by the polymer layer 13, it should be acknowledged that the geometric feature of the first portion 21 is retained. For some examples, the size of the first portion 21 should be deemed as substantially unchanged.

A method for manufacturing a semiconductor structure, which includes the oval conductive bump, is designed for improving the bump connection. The method includes a number of operations and the description and illustrations are not deemed as a limitation as the order of the operations.

Figure 4:
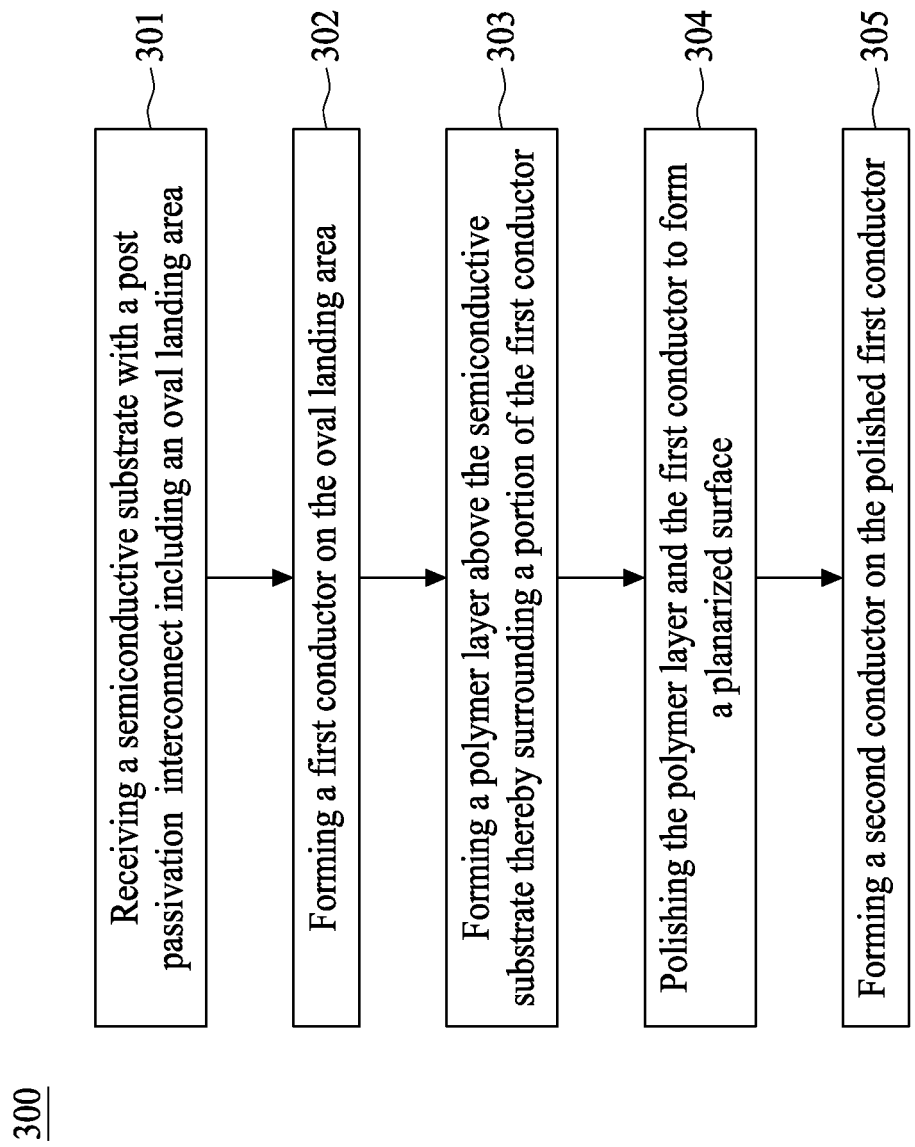
FIG. 4 is a flowchart of a method in fabricating a semiconductor structure according to some embodiments of the present disclosure.

FIG. 4 is a diagram of a method 300 for fabricating a semiconductor structure in accordance with some embodiments of the present disclosure. The method 300 includes several operations, which are discussed in detail with reference to FIGS. 5 to 26. At operation 301, a semiconductive substrate with a post passivation interconnect is received, wherein the post passivation interconnect includes an oval landing area. At operation 302, a first conductor is formed on the oval landing area. At operation 303, a polymer layer is formed above the semiconductive substrate, thereby surrounding a portion of the first conductor. At operation 304, the polymer layer and the first conductor are polished in order to form a planarized surface. At operation 305, a second conductor is formed on the polished first conductor. The term "received" is used in the present paragraph to describe an operation of locating an object to a specific site such as a chuck. The receiving operation includes various steps and processes and varies in accordance with the features of embodiments. In some embodiments, a receiving operation includes holding a semiconductor substrate or a wafer for further spinning motion. In certain embodiments, a receiving operation includes spinning a semiconductor substrate or a wafer in a vacuum condition.

Figure 3:
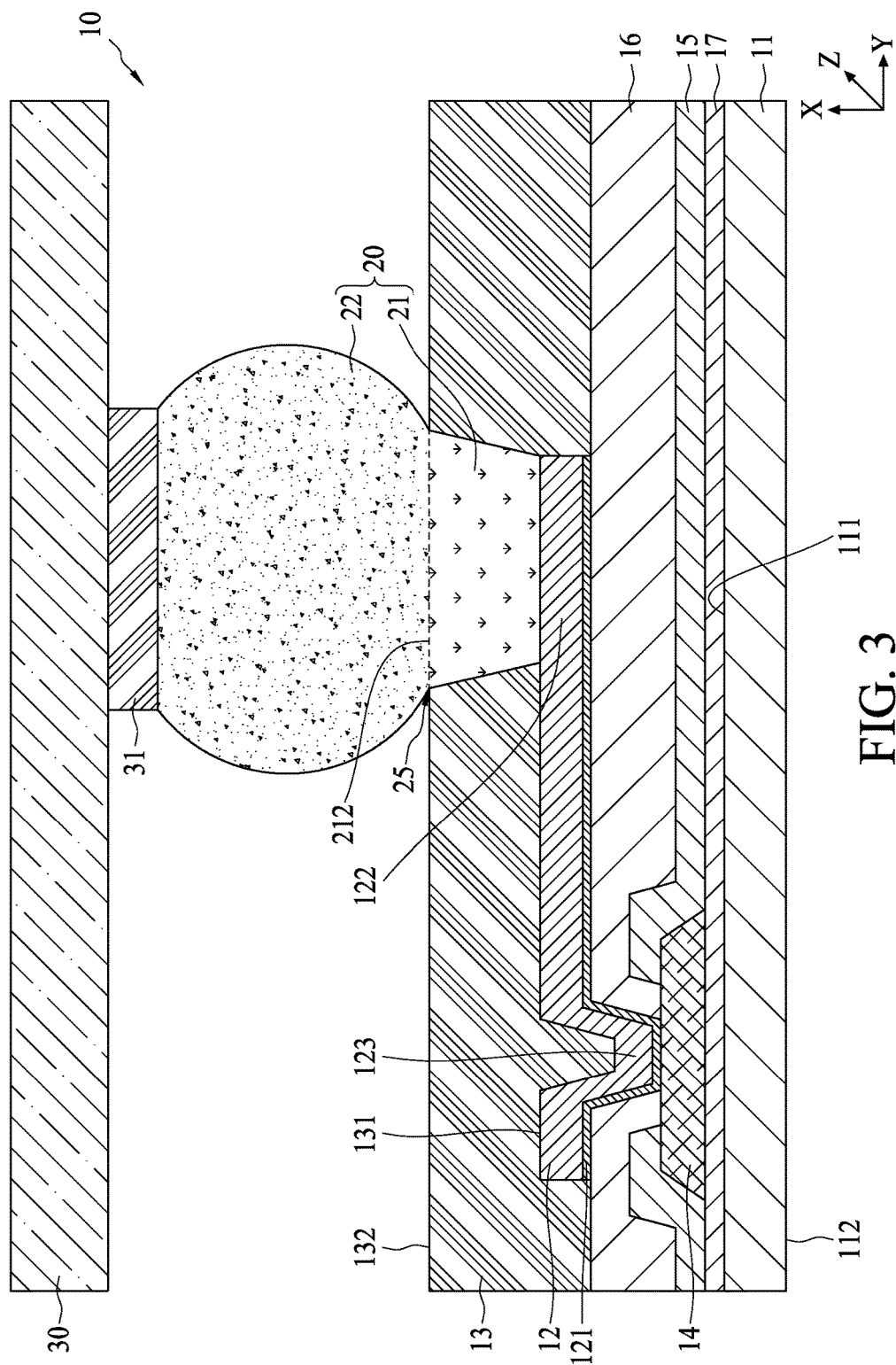
FIG. 3 is a cross-sectional view of a semiconductor structure according to certain embodiments of the present disclosure.

FIGS. 5 to 26 have been simplified for a better understanding of the inventive concepts of the present disclosure. In FIGS. 5 to 26, elements with same labeling numbers as those in FIGS. 1 to 3 are previously discussed with reference thereto and are not repeated here for simplicity.

Figure 5:
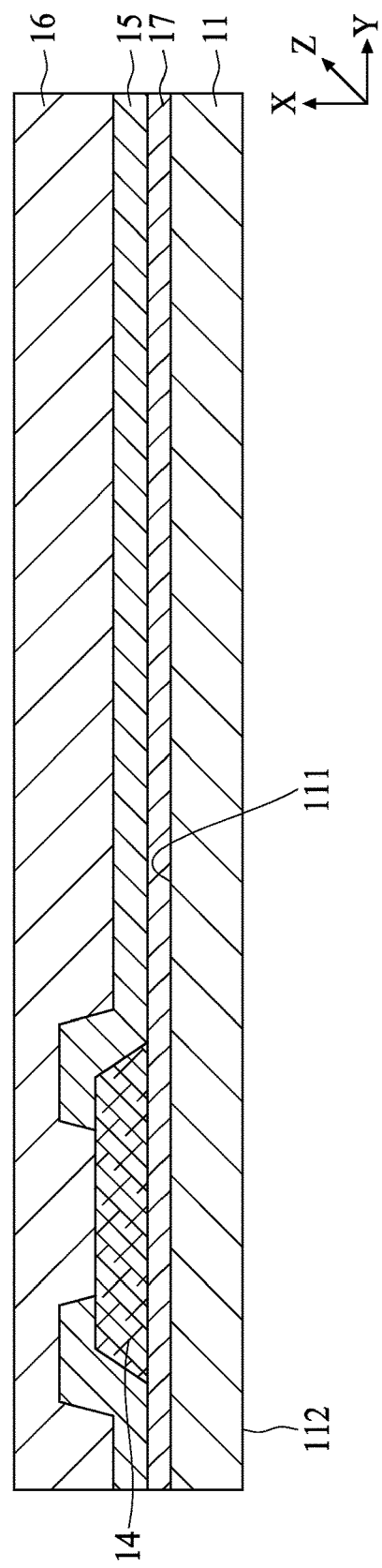
FIGS. 5 to 28 are cross-sectional views corresponding to various operations 301 to 305 in FIG. 4.
Figure 6:
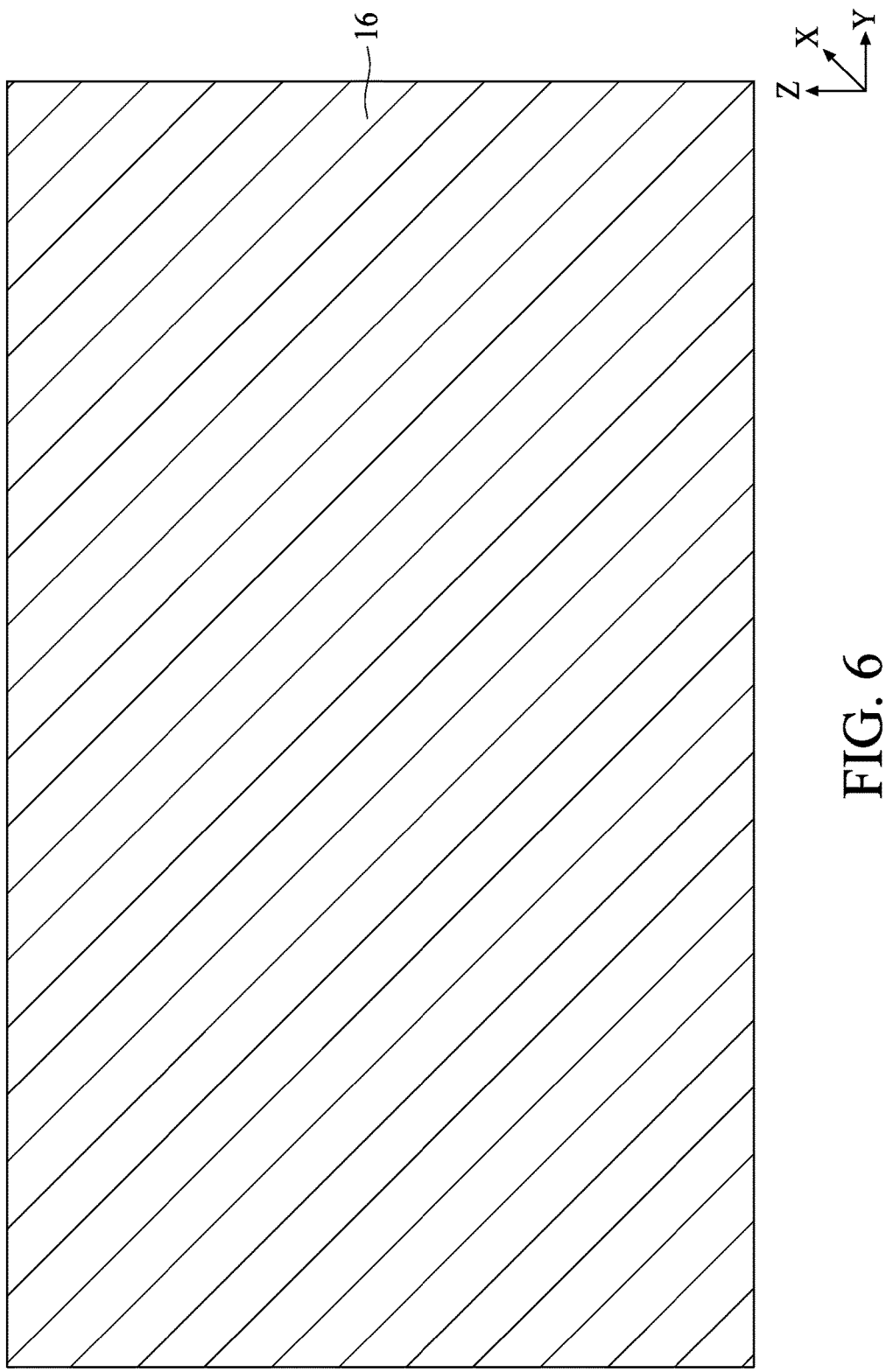

Referring to FIG. 5, the semiconductive substrate 11 is received and FIG. 6 is a top view of FIG. 5. In some embodiments, the semiconductive substrate is on a stage for several operations, such as mask pattern transferring operations. As shown in FIG. 5, passivation layer 15 is patterned to have the metal pad 14 partially exposed. In other embodiments, the passivation layer 15 is formed through any suitable techniques such as CVD. Subsequently, dielectric layer 16 is applied on the passivation layer 15 and is made by any suitable technique such as spin coating.

Figure 7:
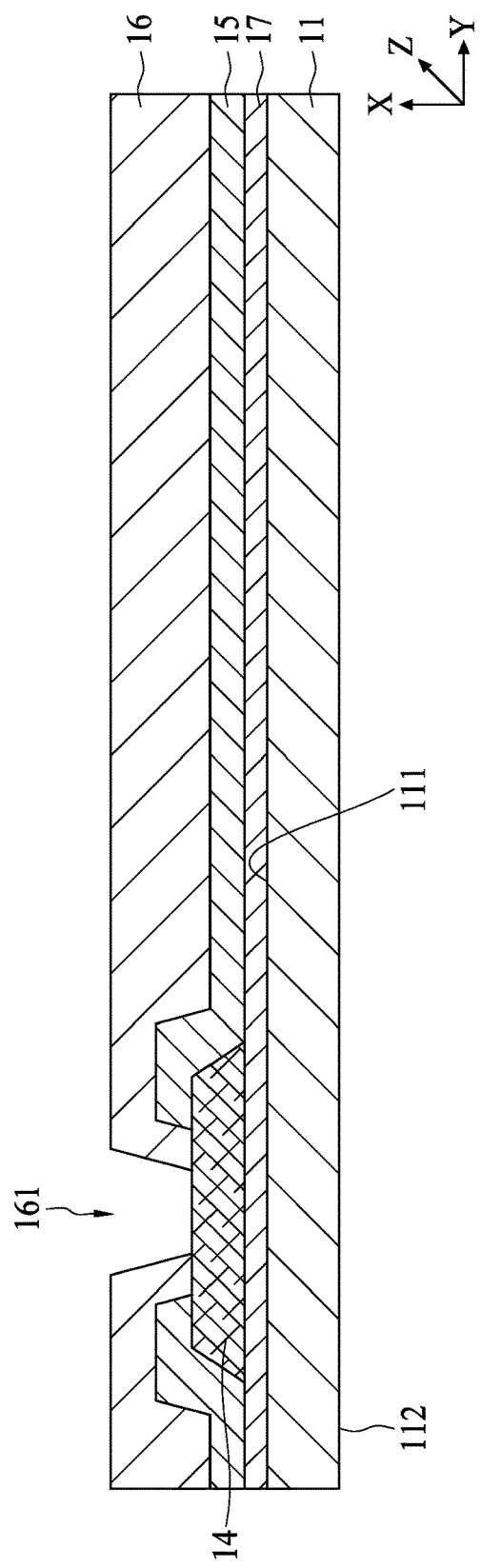
Figure 8:
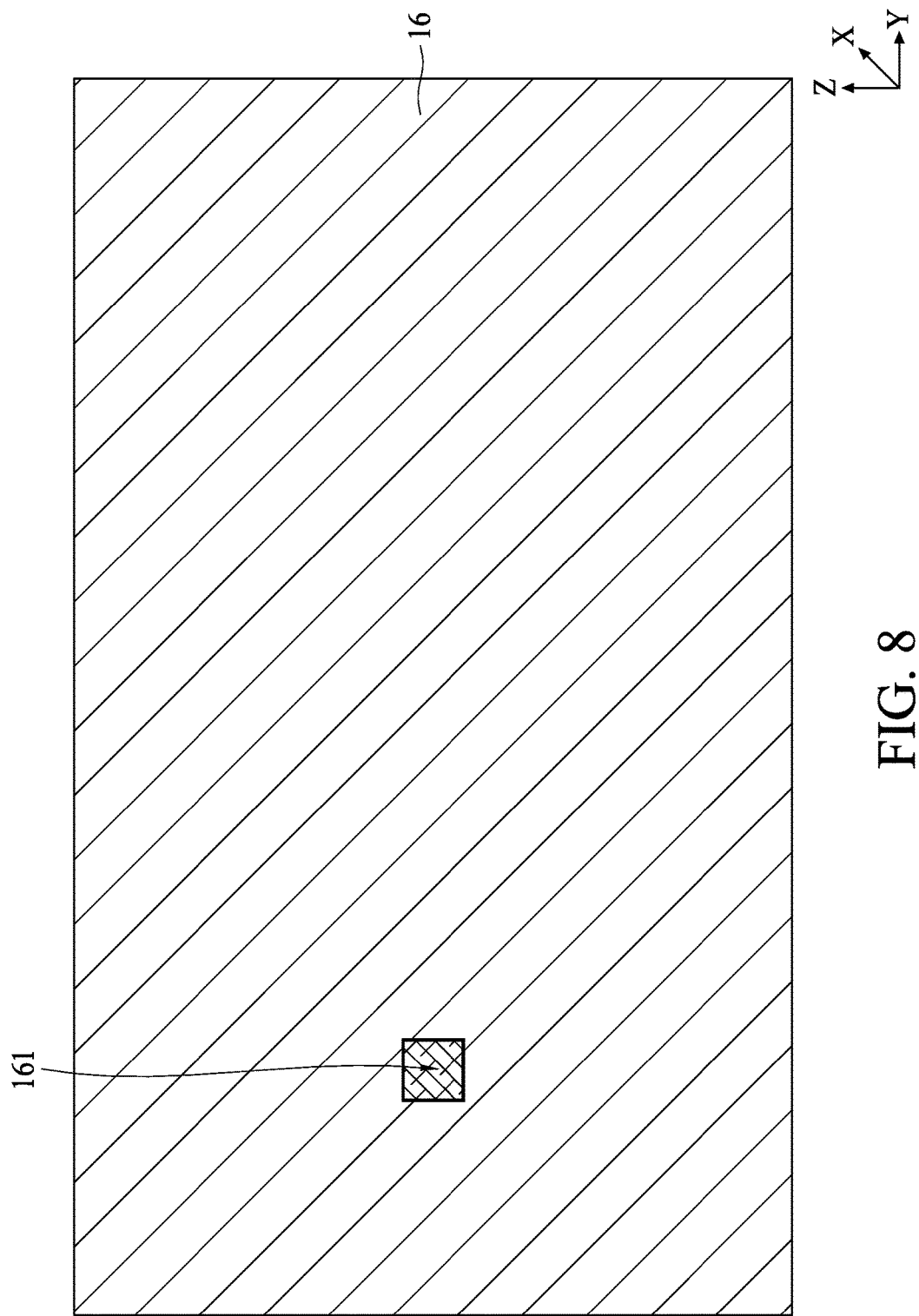

Referring to FIG. 7 and FIG. 8, which is a top view of FIG. 7, the dielectric layer 16 is patterned to form an opening 161 to expose a portion of the metal pad 14. In some embodiments, the dielectric layer 16 is a photo sensitive material such as polyimide, and a mask is used for transferring a pattern on the dielectric layer 16. A lithography operation is combined therewith to form the opening 161.

Figure 9:
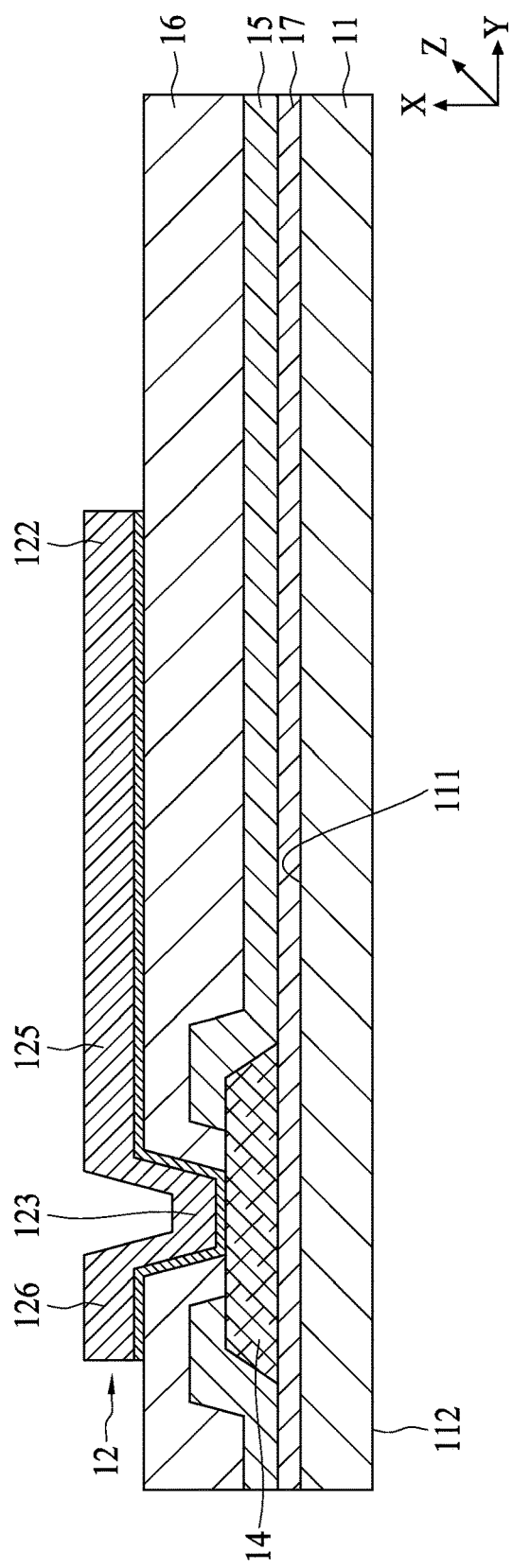
Figure 10:
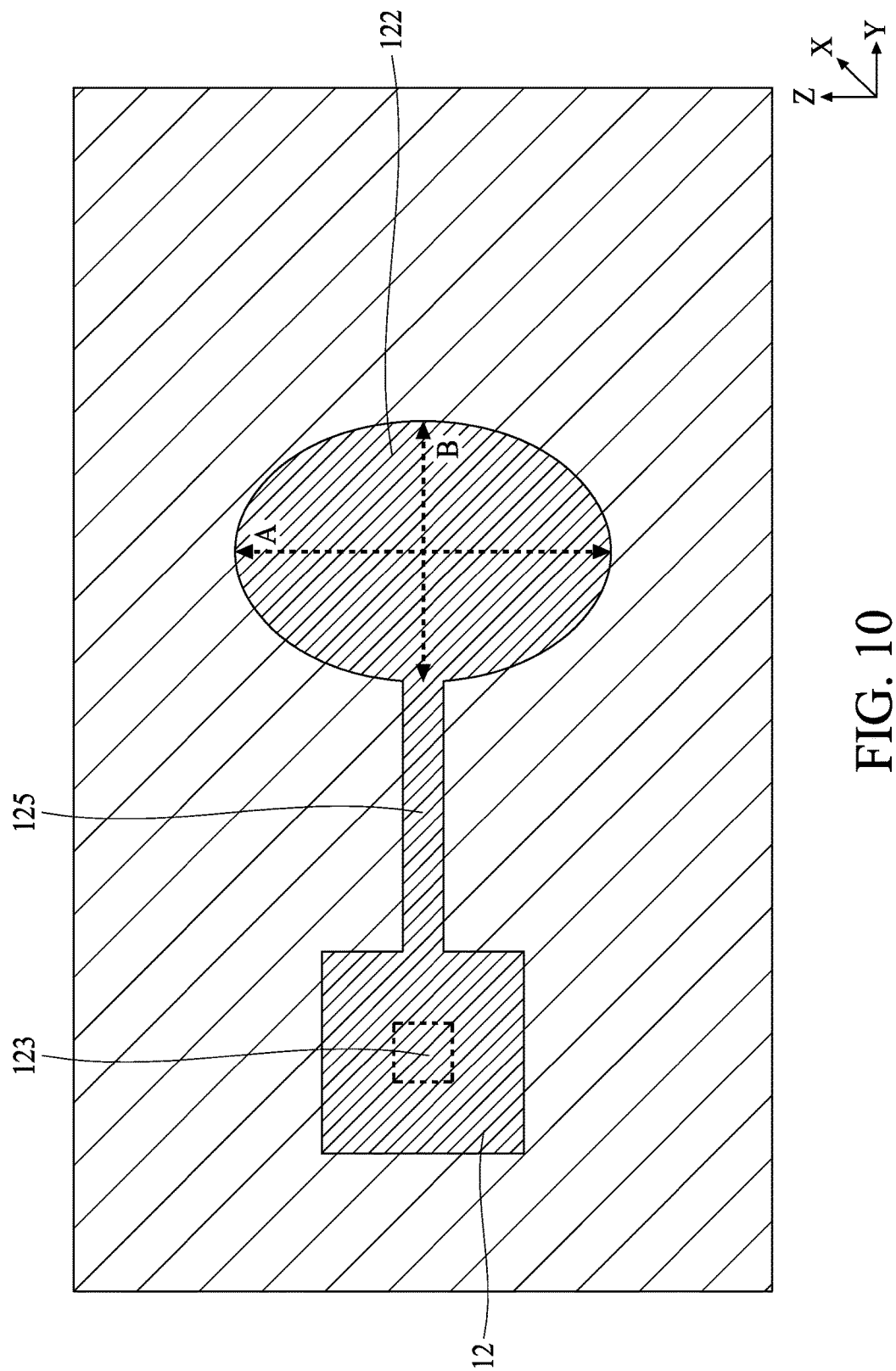

Referring to FIG. 9 and FIG. 10, which is a top view of FIG. 9. A patterned conductive layer 126 is disposed on the dielectric layer 16 and extending into the opening 161 so as to form the PPI 12. The PPI 12 coupled with the metal pad 14 can be formed by various approaches.

Figure 11:
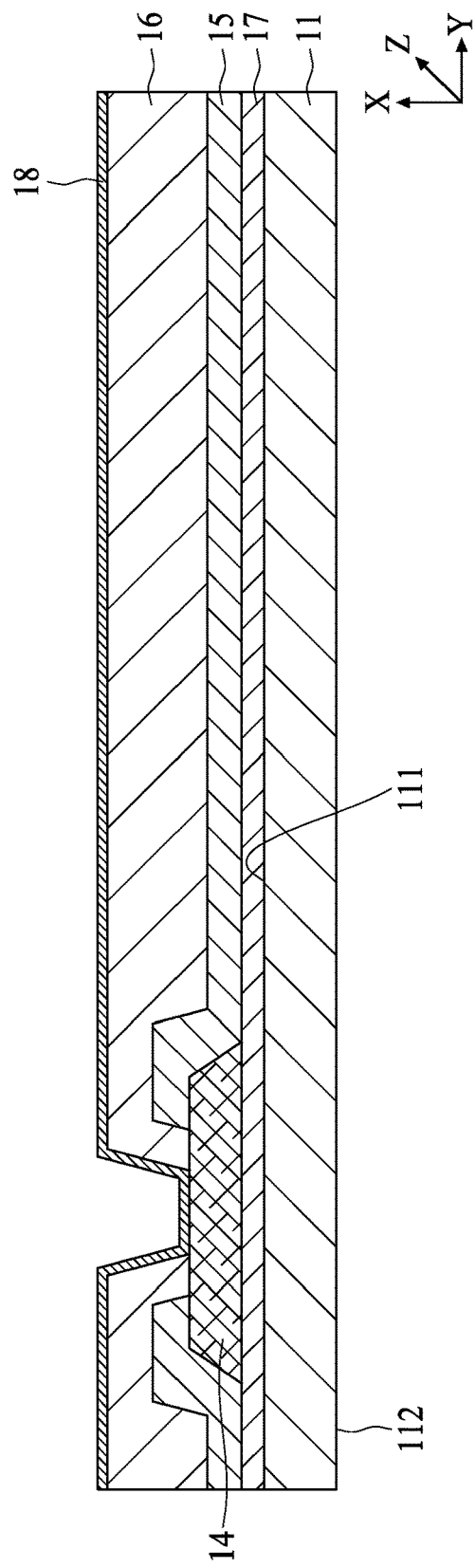
Figure 12:
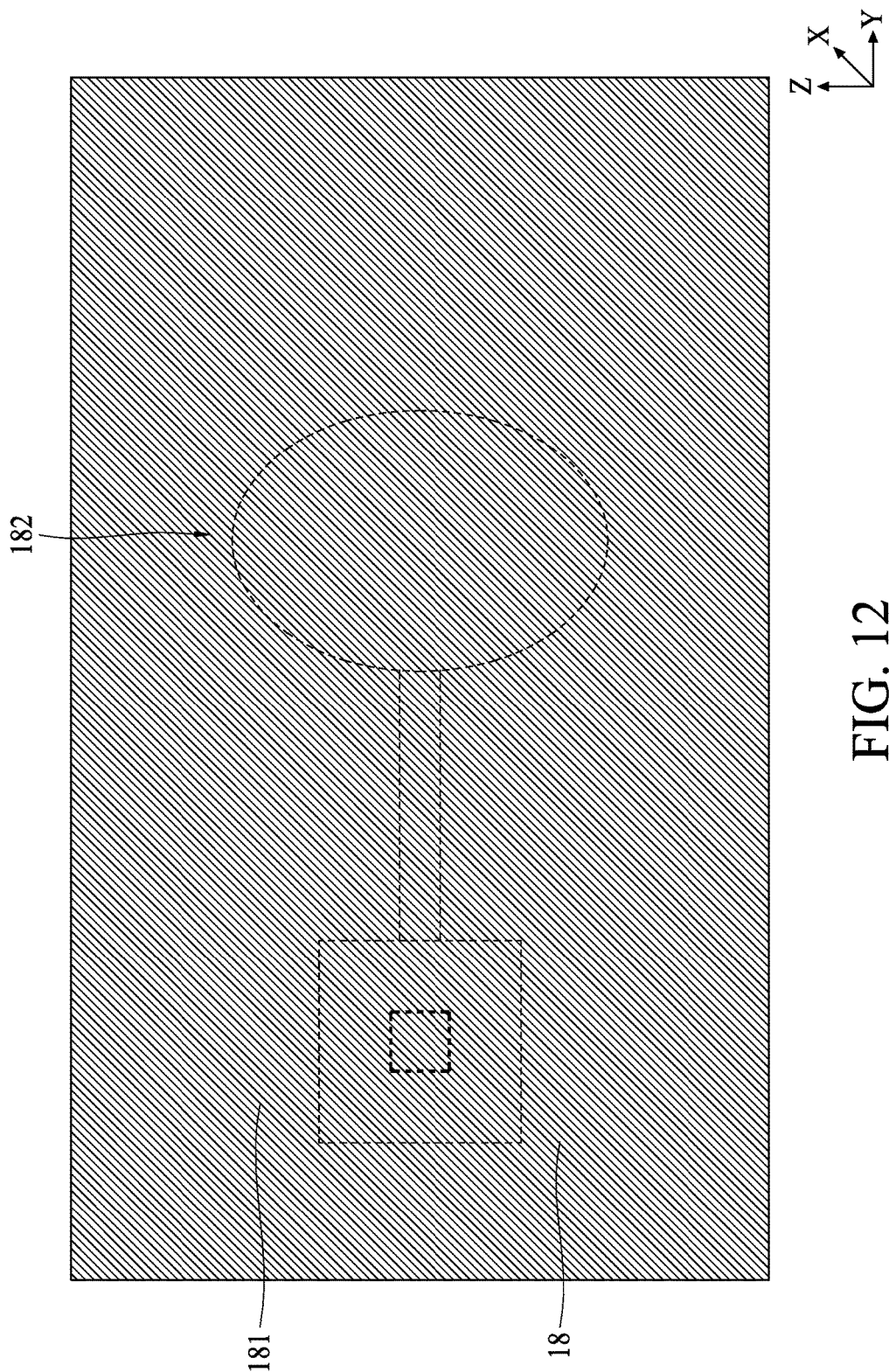

One example of forming the patterned PPI 12 is a suitable technique such as electroplating and illustrated in FIGS. 11-16. As shown in FIG. 11 and its corresponding top view FIG. 12, a seed or conductive layer 18 is blanket deposited on the dielectric layer 16. The conductive layer 18 may include at least one film and be formed by deposition such as sputtering, vaporization, or other suitable methods. In some embodiments, a hybrid deposition method including CVD (Chemical Vapor Deposition) and PVD (Physical Vapor Deposition) is introduced to achieve a better gap filling in the opening 161.

Figure 13:
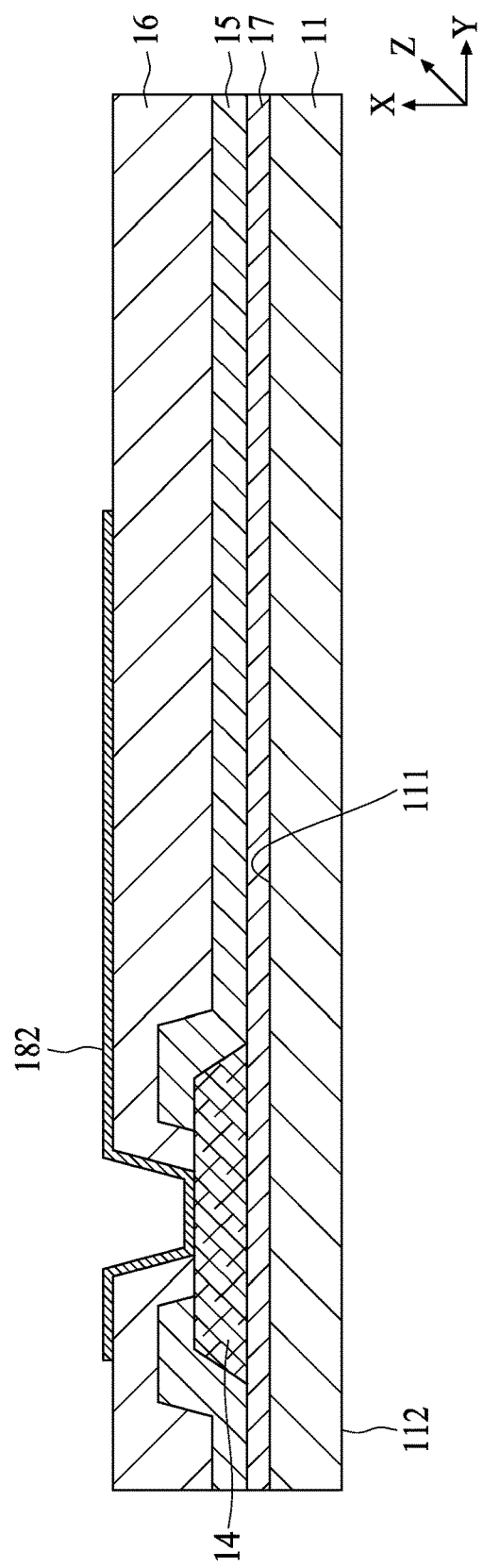
Figure 14:
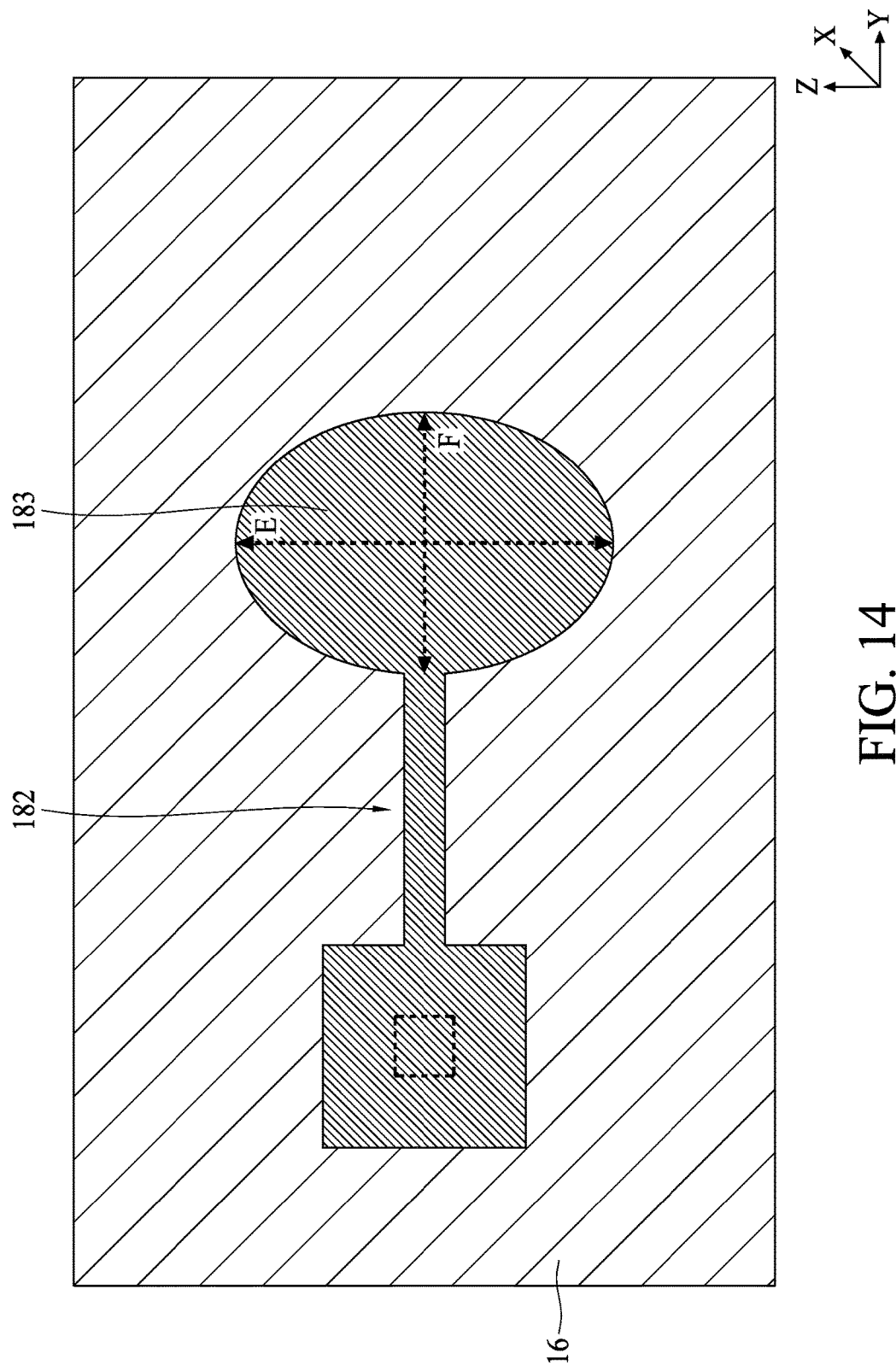

The conductive layer 18 is patterned as shown in FIG. 13 and corresponding top view FIG. 14. Appropriate etchant is adopted to remove portion 181 of the conductive layer 18 so as to form a patterned conductive layer 182, which further includes an oval-shaped portion 183. In other words, etching the portion 181 forms an oval area 183 of the conductive layer 18. The oval area 183 includes a longest axis E and a shortest axis F with an aspect ratio substantially equal to the aspect ratio of the landing area of the PPI 12 as previously discussed.

Figure 15:
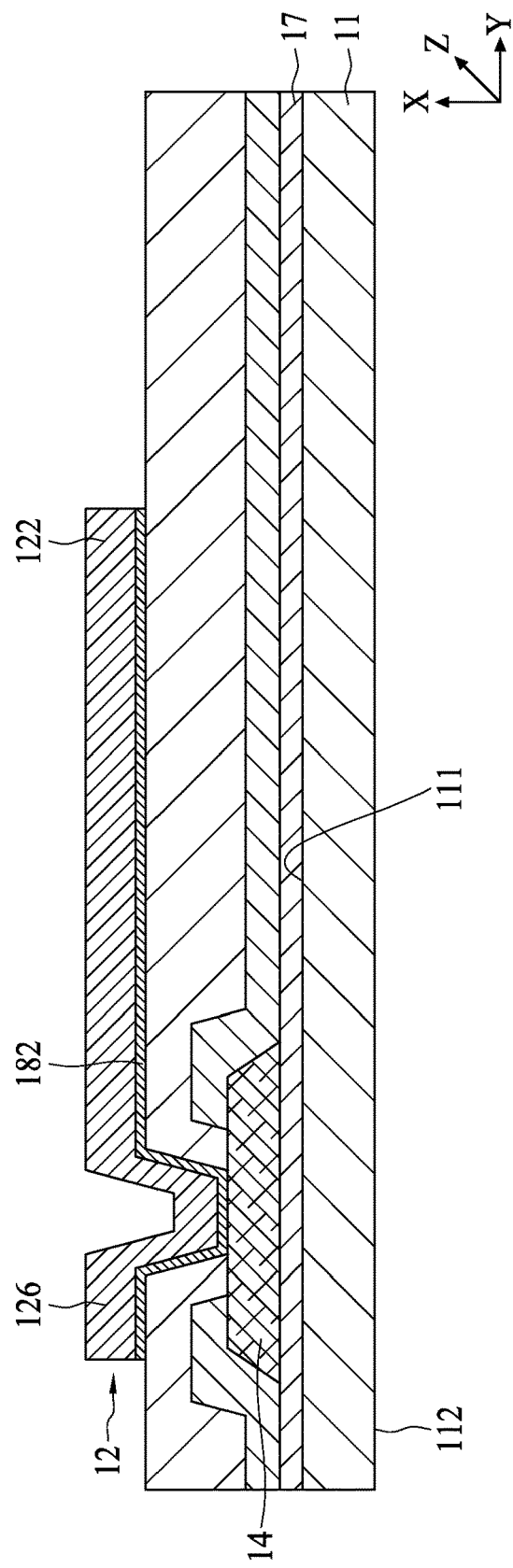
Figure 16:
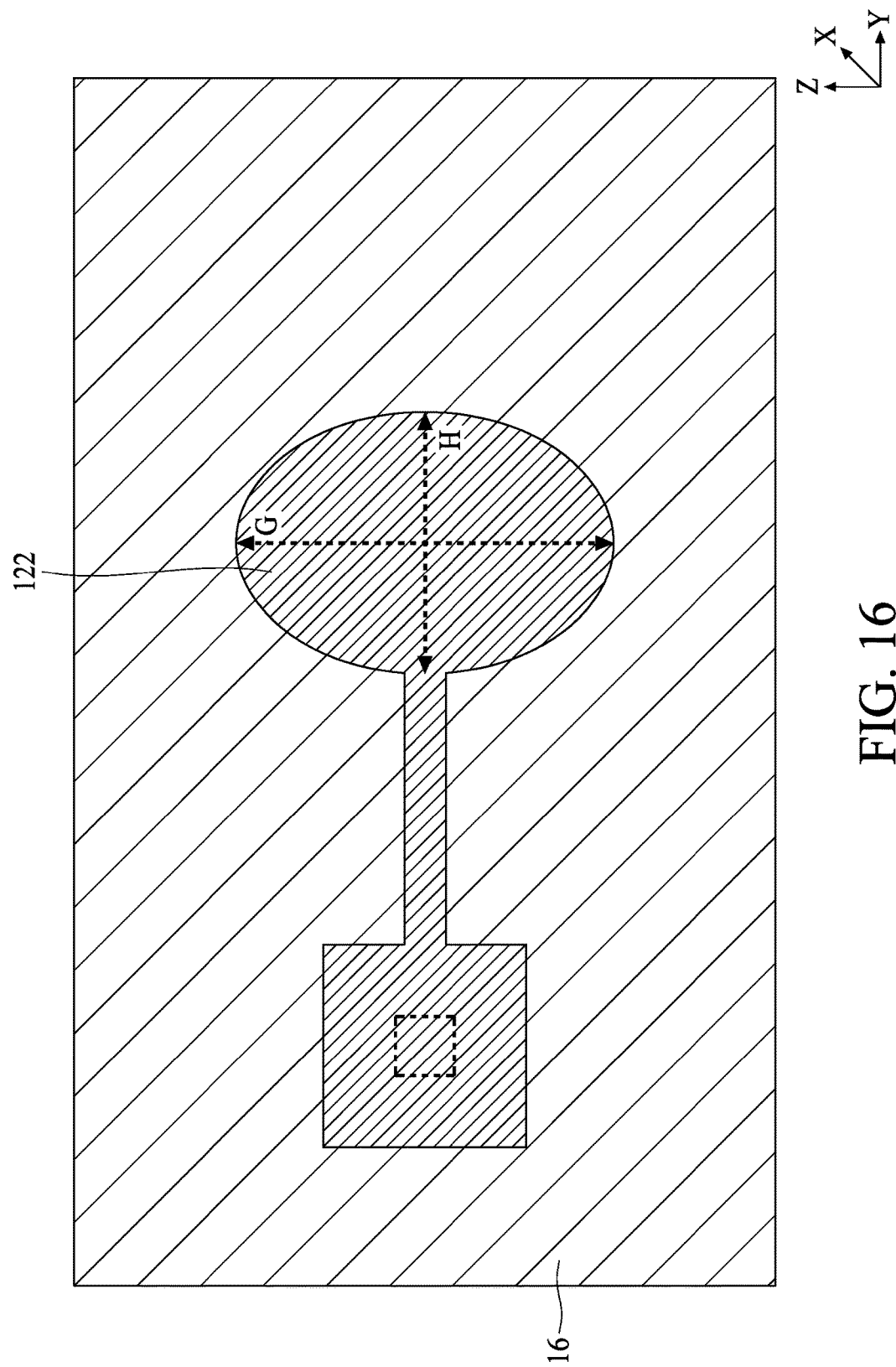

The layout of the patterned conductive layer 182 is designed to provide a site for proceeding electroplating operation. Referring to FIG. 15, and FIG. 16, which is a top view of FIG. 15, the conductive layer 126 is electroplated on the portion 182 through a suitable electroplating method, such as copper electrochemical plating. The conductive layer 126 is formed on the portion 182 to form a metal line of the PPI 12, which including an oval conductive pad 122.

In alternative embodiments, after the conductive layer 18 is blanket deposited on the dielectric layer 16, a photoresist (not shown) is patterned atop the conductive layer 18 and covers a portion of the conductive layer 18. The exposed conductive layer 18 provides a site for subsequent electroplating operation and the conductive layer 126 is electroplated on the exposed portion of the conductive layer 18. Subsequently, the patterned photoresist and conductive layer 18 under the photoresist are removed through an etchant, which has a high selectivity between the conductive layer 126 and the conductive layer 18 so that the PPI 12 and the oval pad 122 are formed.

Figure 17:
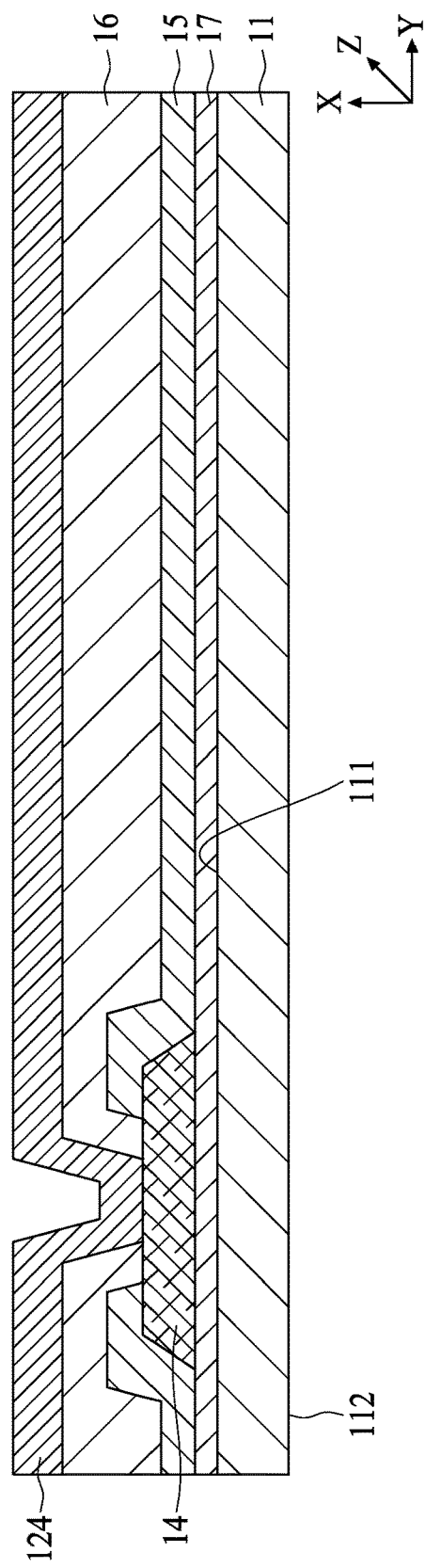
Figure 18:
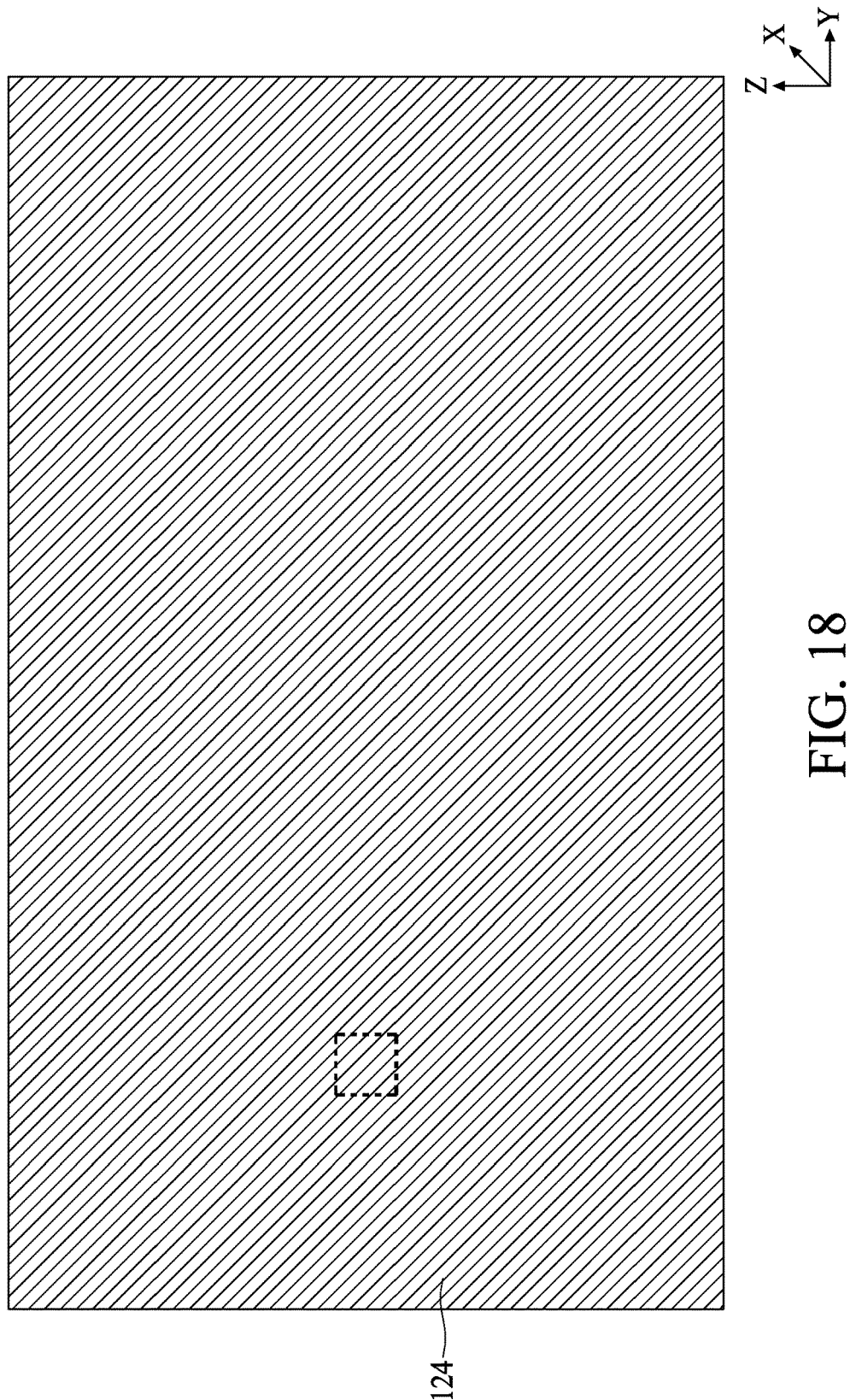

Another example of forming the patterned PPI 12 is a suitable method combining a conductive layer deposition and a subsequent lithography operation. FIGS. 17-20 illustrate some operations of the example. As shown in FIG. 17, and FIG. 18, which is a corresponding top view of FIG. 17, a conductive layer 124 is blanket disposed on the dielectric layer 16 and extends into the opening 161 of the dielectric layer 16. The conductive layer 124 may include conductive material such as copper, tungsten, aluminum, and/or alloys thereof. The conductive layer 124 is disposed by using suitable fabrication techniques such as sputtering, CVD or the like. The conductive layer 124 lines the bottom and sidewalls of the opening 161 to be electrically connected to the metal pad 14.

Figure 19:
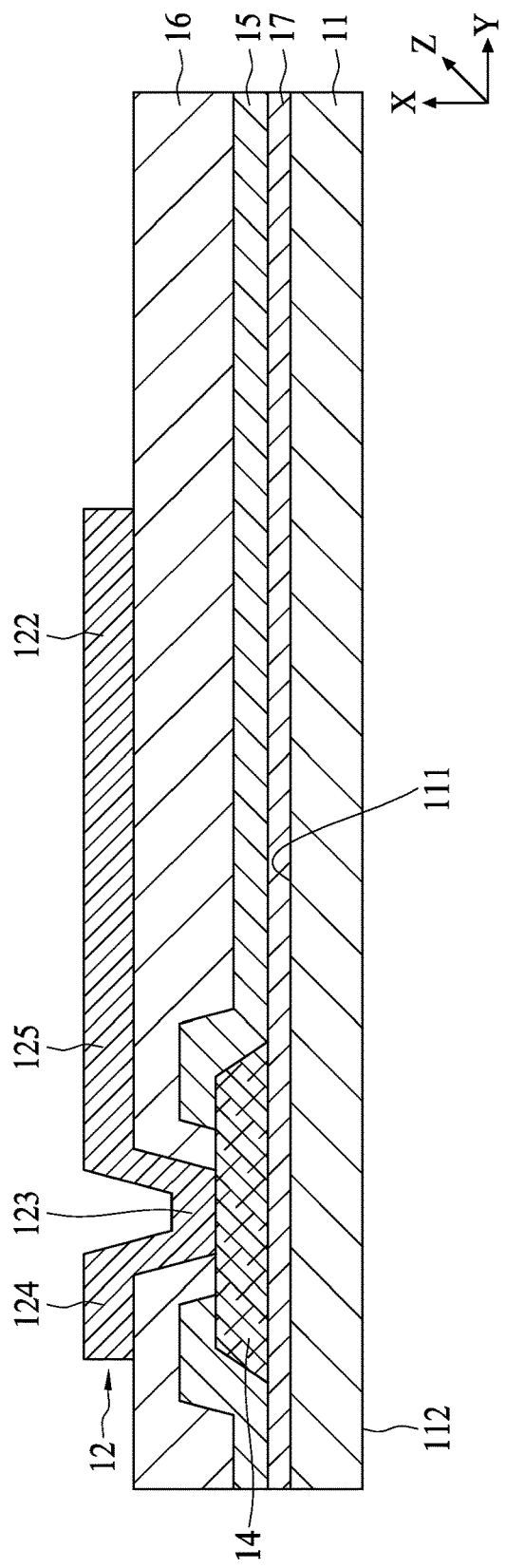
Figure 20:
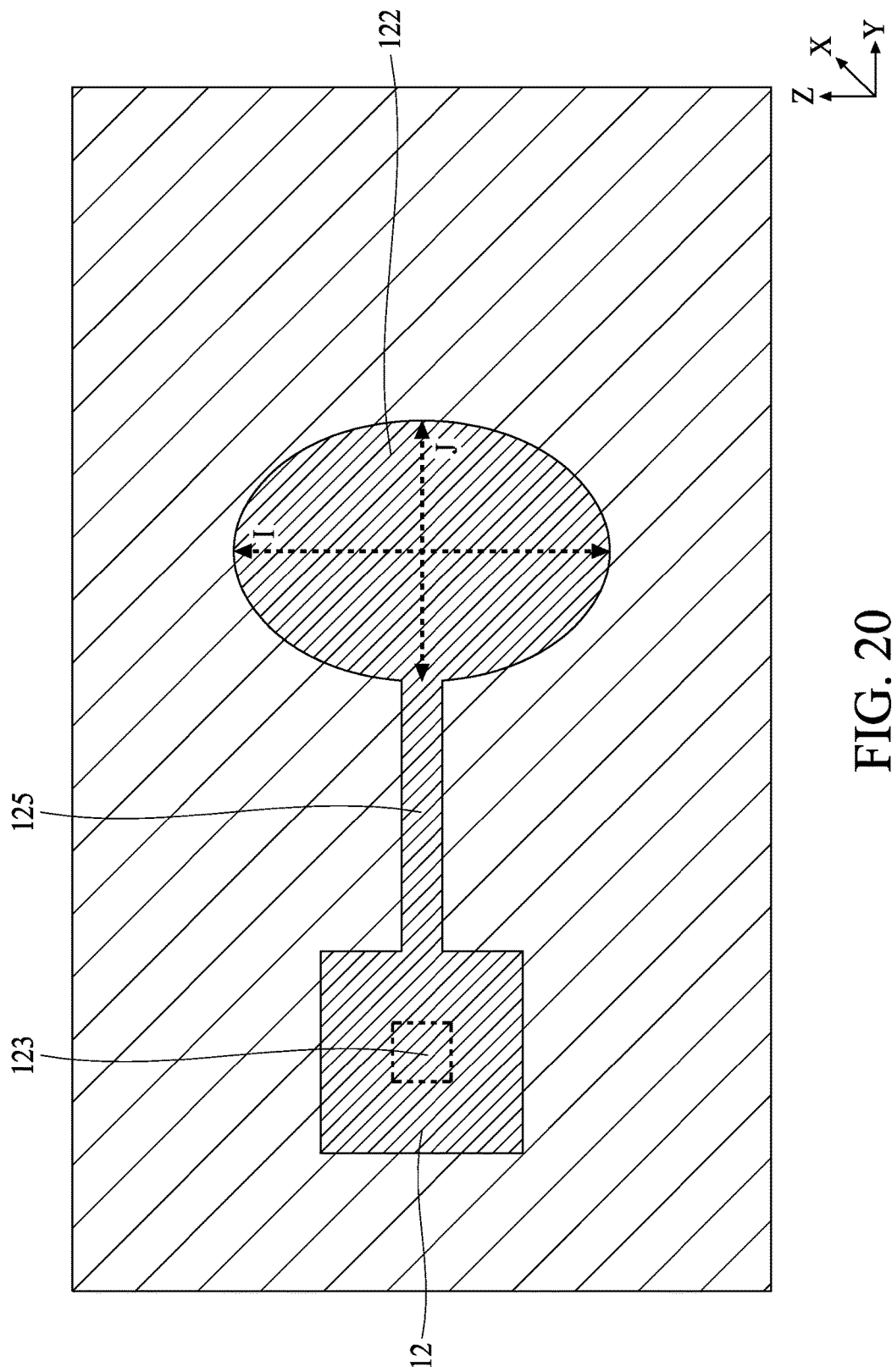

The conductive layer 124 is patterned as shown in FIG. 19, and FIG. 20, which is a corresponding top view of FIG. 19. The patterning operation may be implemented by using suitable techniques such as an etching operation or a laser ablation operation. According to the shape and location of the PPI 12, a portion of the conductive layer 124 is removed. For some embodiments, a laser beam with wavelength about 308 nm is used to remove a portion of the conductive layer 124. The energy dosage of the laser beam is in range from about 500 mj/cm$^2$ to about 600 mj/cm$^2$. In alternative embodiments, in accordance with the shaped and location of the PPI 12, a mask (not shown) protects a portion of the conductive layer 124. Appropriate etchant is adopted to carve the unprotected portion of the conductive layer 124 so as to form the first portion 122 and the second portion 123 as previously discussed.

As shown in FIG. 19 and FIG. 20, the first portion 122 is electrically connected to the second portion 123 via a conductive trace 125 and in an oval shape. The first portion 122 includes the longest axis I and a shortest axis J. The longest axis I is along a direction toward the geometric center C, and toward the second portion 123 of the PPI 12.

Figure 21:
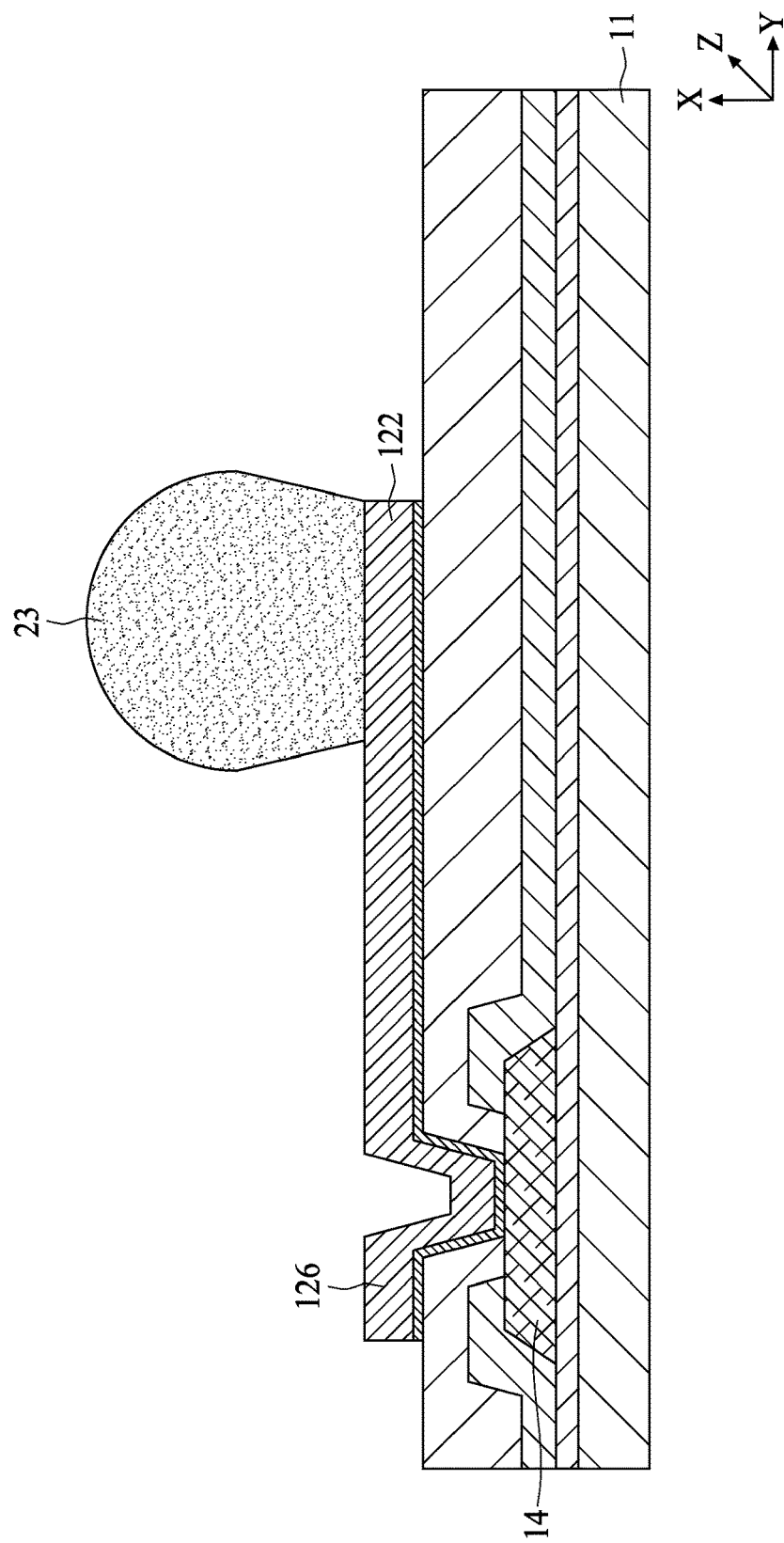
Figure 22:
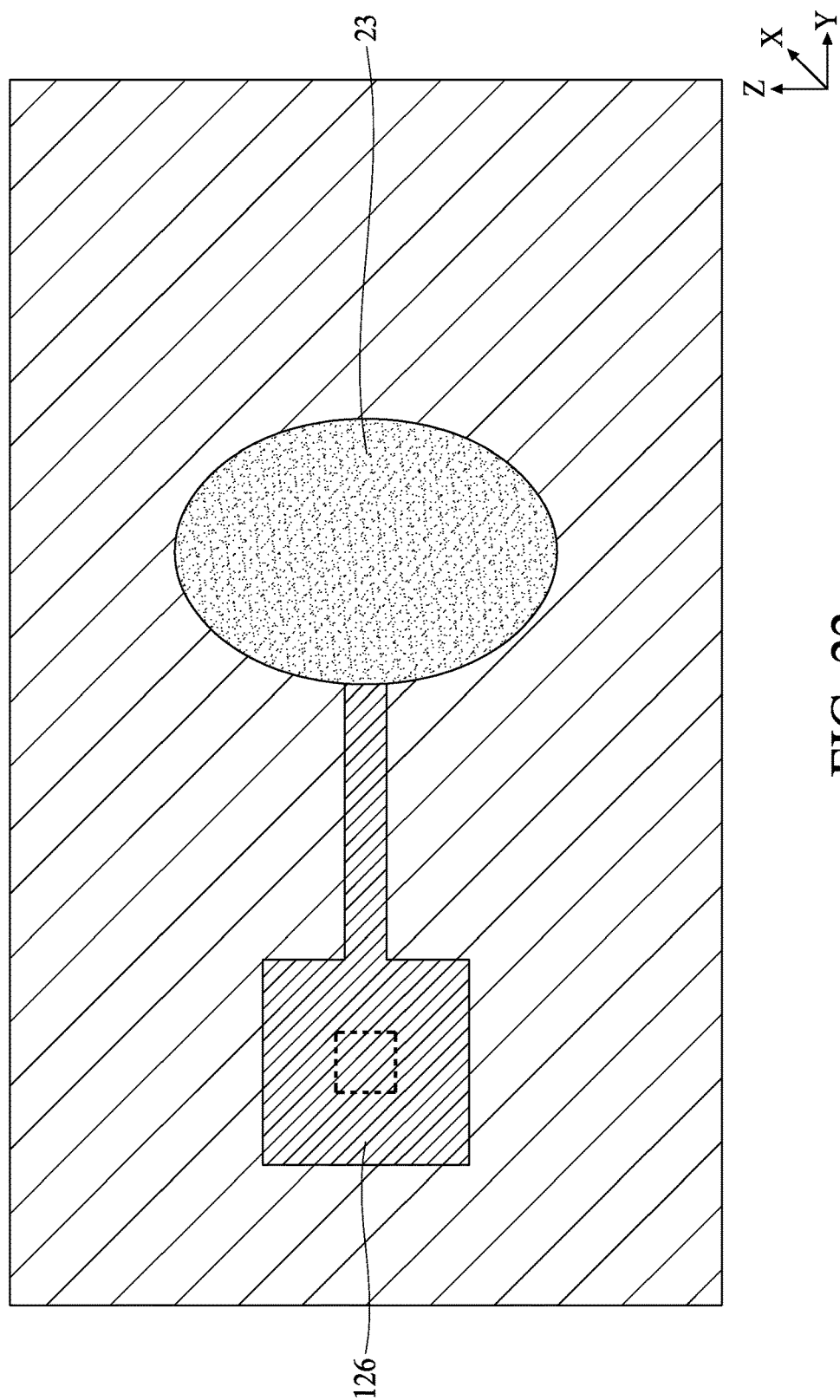

Referring to FIG. 21 and FIG. 22, which is a corresponding top view of FIG. 21, a first conductor 23 is formed on the oval conductive pad 122 by ball drop, stencil, pasting, electroplating or so on. Since the oval conductive pad 122 is in an oval shape, the first conductor 23 disposed thereon follows the contour of the conductive pad 122. Therefore the first conductor 23 substantially possesses an oval cross sectional area, which may have a same aspect ratio of the conductive pad 122. Same as the conductive pad 122, the longest axis of the first conductor 23 is also toward the geometric center of the semiconductor structure so that the first conductor 23 is more resistant to a shear stress. Thus, cracking and damage to the first conductor 23 can be avoided.

Figure 23:
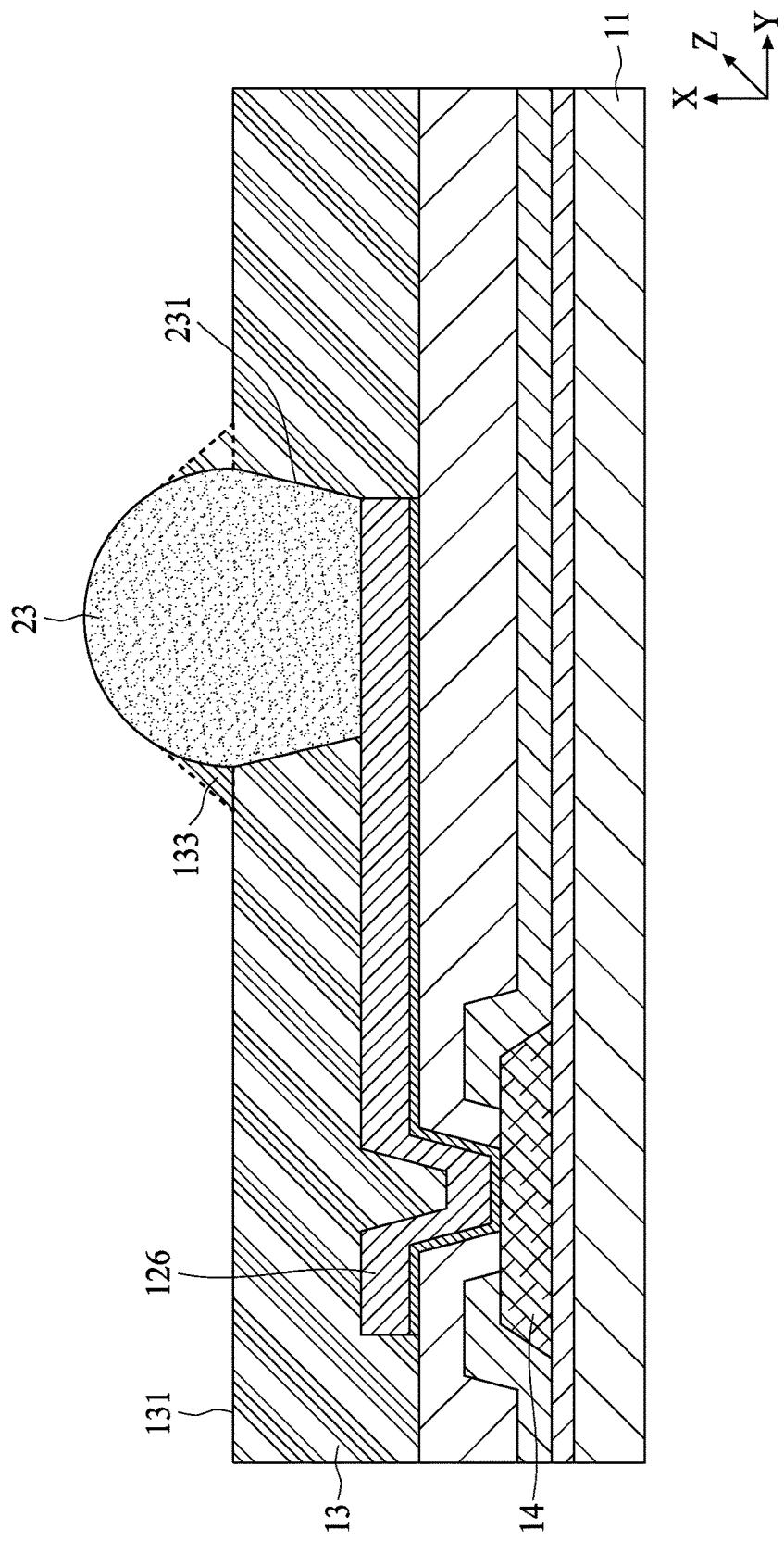
Figure 24:
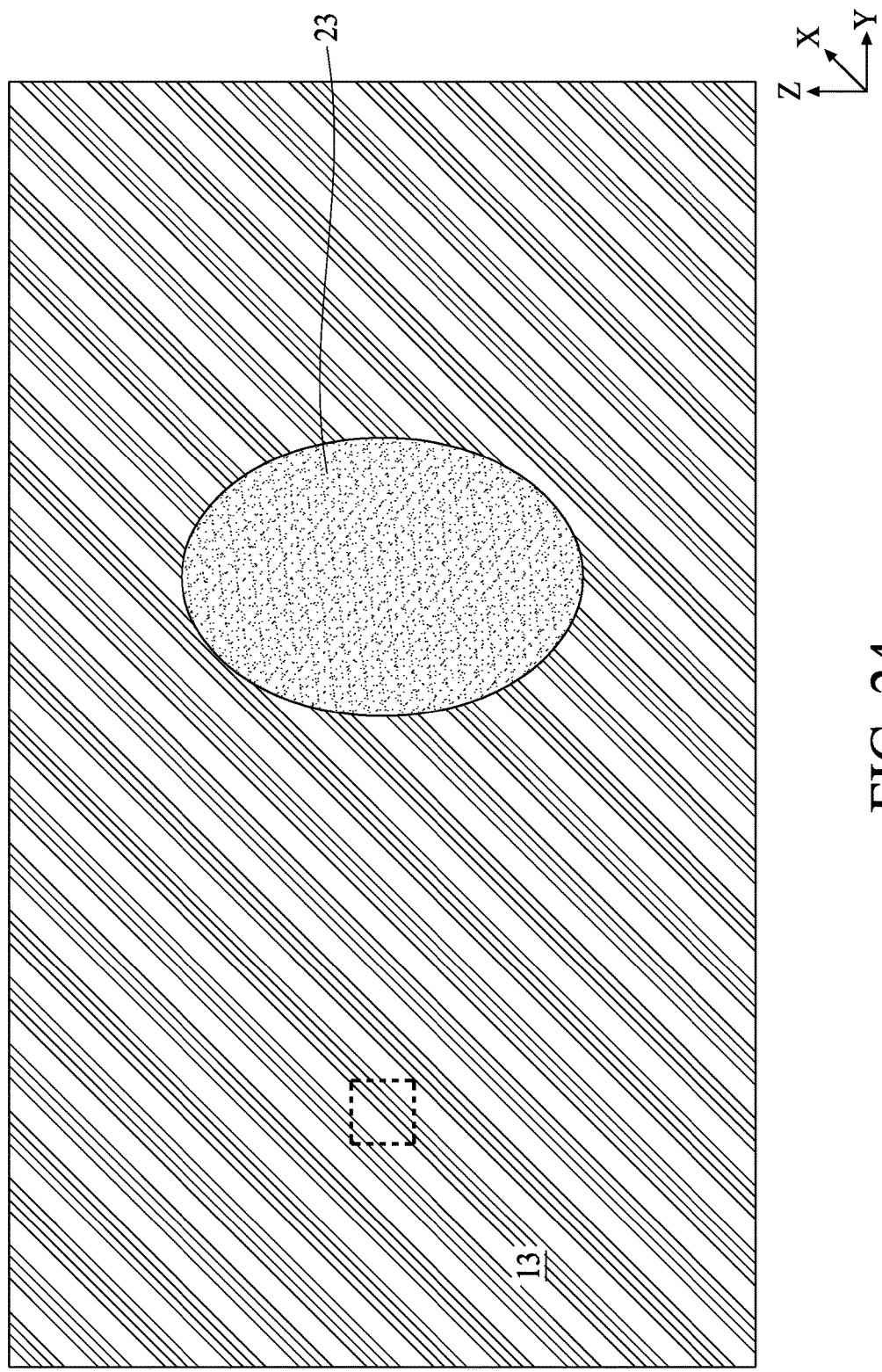

Referring to FIG. 23 and FIG. 24, which is a corresponding top view of FIG. 23, the polymer layer 13 is formed over the conductive layer 126 by any suitable technique such as spin coating and surrounds a portion 231 of the first conductor 23. The polymer layer 13 may include a thickness in a range from about 4 μm to about 10 μm. Due to surface tension, a portion 133 of the polymer layer 13 is higher than a top surface 131 of the polymer layer 13.

Figure 25:
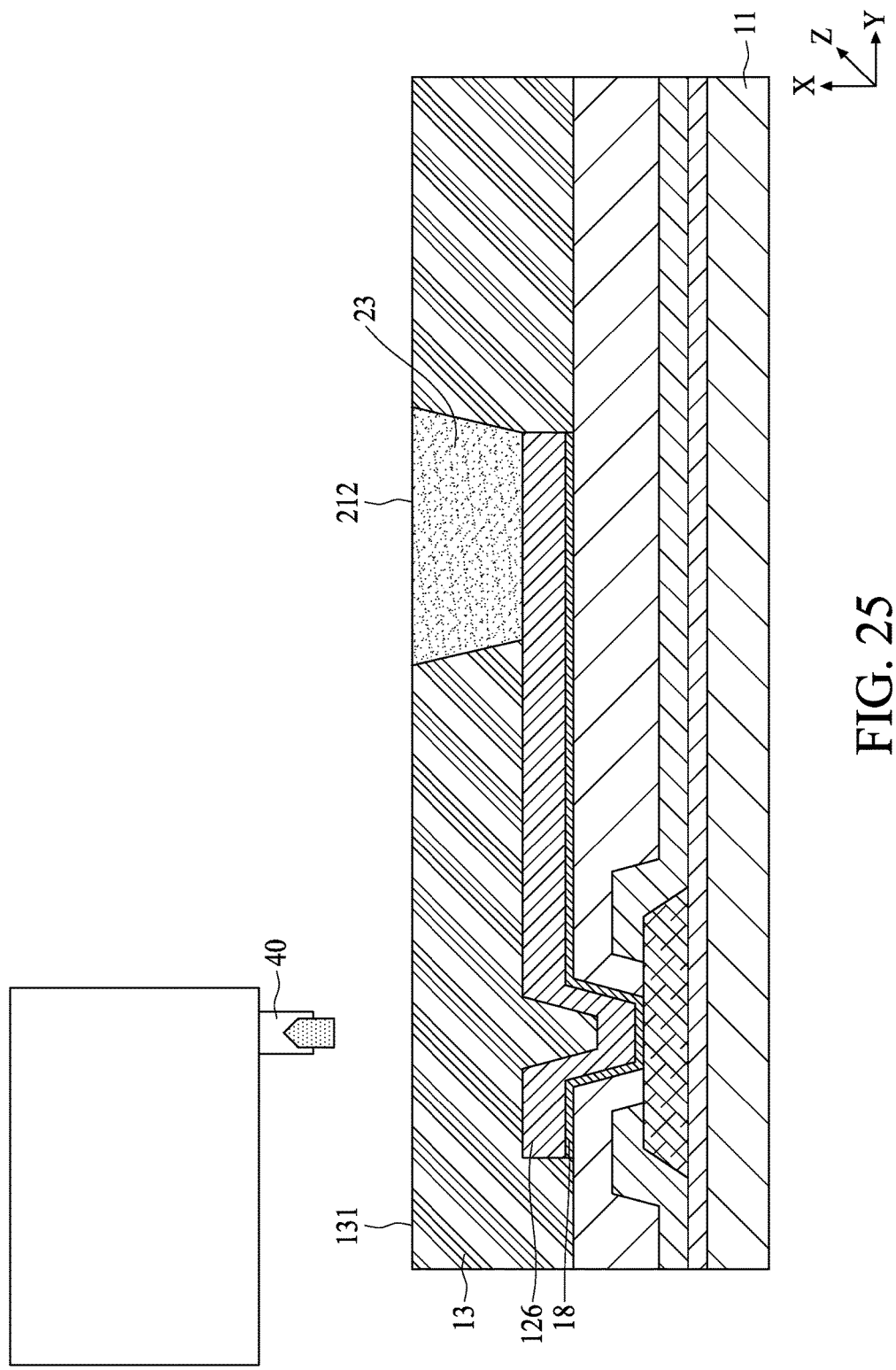
Figure 26:
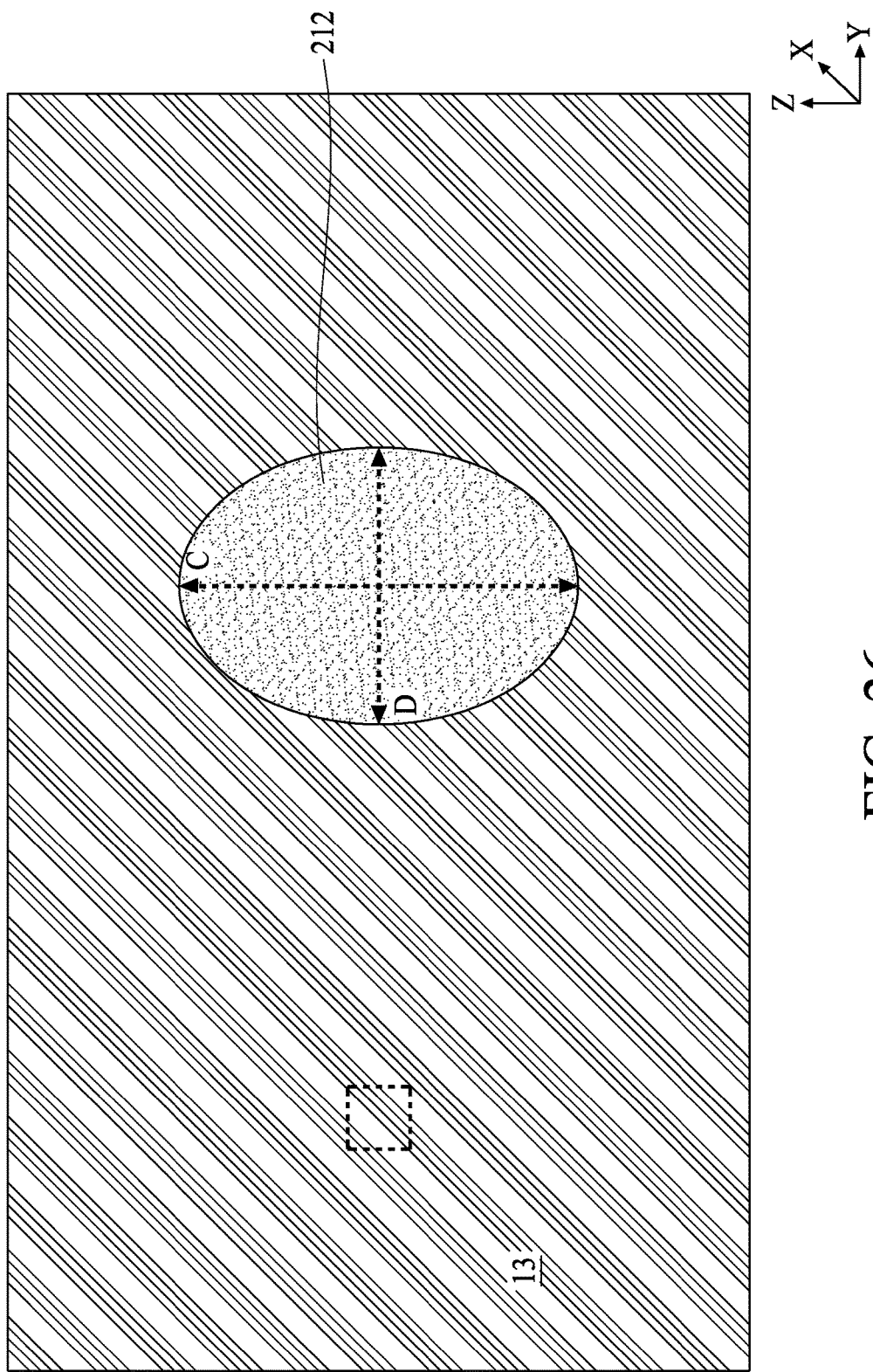

Referring to FIG. 25 and FIG. 26, which is a corresponding top view of FIG. 25, the polymer layer 13 and the first conductor 23 can be ground by various approaches. One example of polishing the polymer layer 13 and the first conductor 23 is by applying a diamond disk 40 thereon to form a planarized surface 212. In other words, the top planarized surface 212 of the first conductor 23 is exposed during the polishing operation; meanwhile the portion 133 of the polymer layer 13 is removed so that the top surface 131 of the polymer layer 13 and the top surface 212 of the first conductor 23 are substantially coplanar. Another example of grinding the polymer layer 13 and the first conductor 23 is by applying a slurry (not shown) on the polymer layer 13 and the first conductor 23 to grind or polish the polymer layer 13 and the first conductor 23. In some embodiments, an operation is introduced to measure the thickness of the polymer layer 13 or the first conductor 23, after polishing the polymer layer 13 and the first conductor 23.

The polymer layer 13 and the first conductor 23 are partially removed so as to expose an oval-shaped surface 212 of the first conductor 23. The oval-shaped surface 212 is used for receiving a second conductor.

In some embodiments, as in FIG. 26, the top surface 212 of the first conductor 23 is exposed and formed in an oval shape attributed from the first portion 122 of the PPI 12. The top surface 212 is the projective area as previously discussed and hence, the top surface 212 includes a longest axis C and a shortest axis D. In certain embodiments, the polymer layer 13 and the first conductor 23 are ground until the longest axis C of the top surface 212 is substantially the same with the longest axis A of the first portion 122 of the PPI 12.

Figure 27:
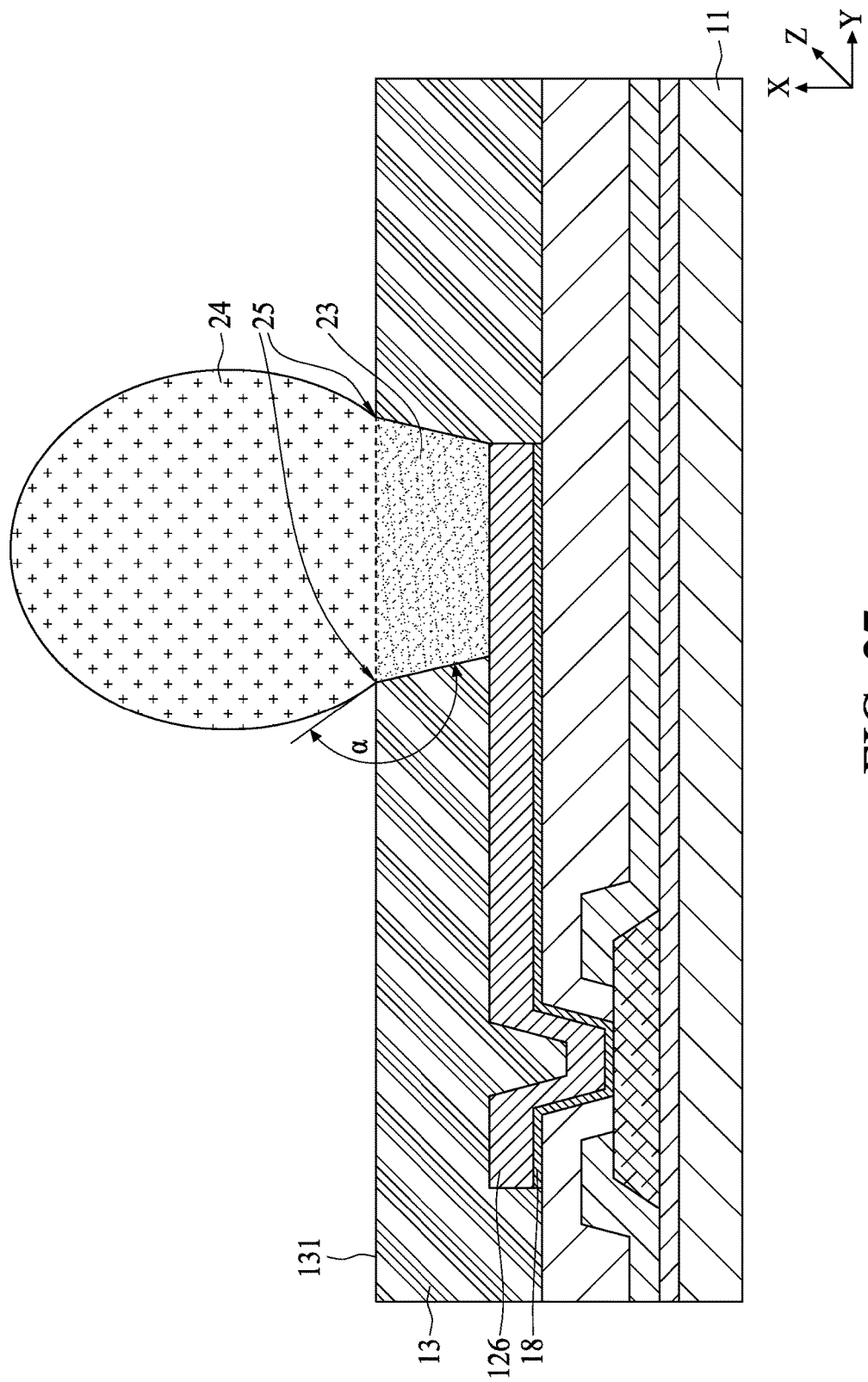
Figure 28:
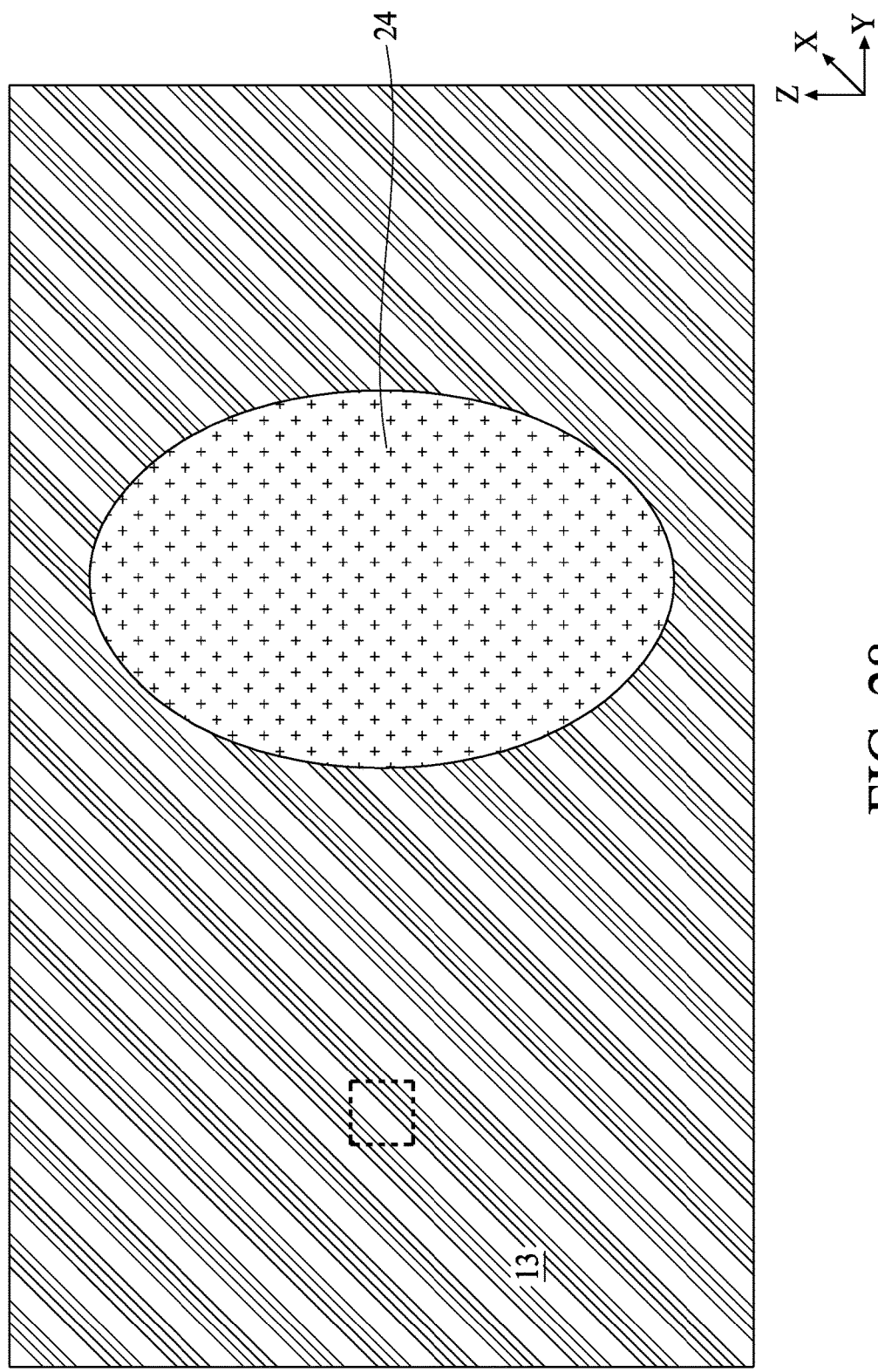

Referring to FIG. 27 and FIG. 28, which is a corresponding top view of FIG. 27, the second conductor 24 is disposed on the oval-shaped surface 212 of the first conductor 23 so as to achieve the semiconductor structure. In other words, the second conductor 24 is formed on the polished first conductor 23 so that the top surface 212 or the projective area is occupied by the second conductor 24. In some embodiments, the second conductor 24 is reflowed to form a turning point 25 at an intersection between the first conductor 23 and the second conductor 24. In other words, the turning point 25 is between the first conductor 23 and the second conductor 24. In certain embodiments, the second conductor 24 is connected to a printed circuit board 30 as shown in FIG. 3.

In some embodiments, a curvature of the first conductor 23 is smaller than a curvature of the second conductor 24. A ratio of the curvature of the first conductor 23 to the curvature of the second conductor 24 is from about 3/5 to about 2/3. In certain embodiments, the ratio of the curvature of the first conductor 23 to the curvature of the second conductor 24 is from about 3/7 to about 3/4. In other embodiments, the ratio of the curvature of the first conductor 23 to the curvature of the second conductor 24 is from about 3/8 to about 3/5. In other embodiments, the ratio of the curvature of the first conductor 23 to the curvature of the second conductor 24 is from about 3/11 to about 4/5.

In some embodiments, as in FIG. 27, a sidewall of the first conductor 23 and a tangent line at the turning point 25 form an angle α. The angle α is from about 93° to about 102°. In certain embodiments, the included angle α is from about 99° to about 118°. In other embodiments, the included angle α is from about 106° to about 132°. In additional embodiments, the included angle α is from about 112° to about 147°.

Figure 29:
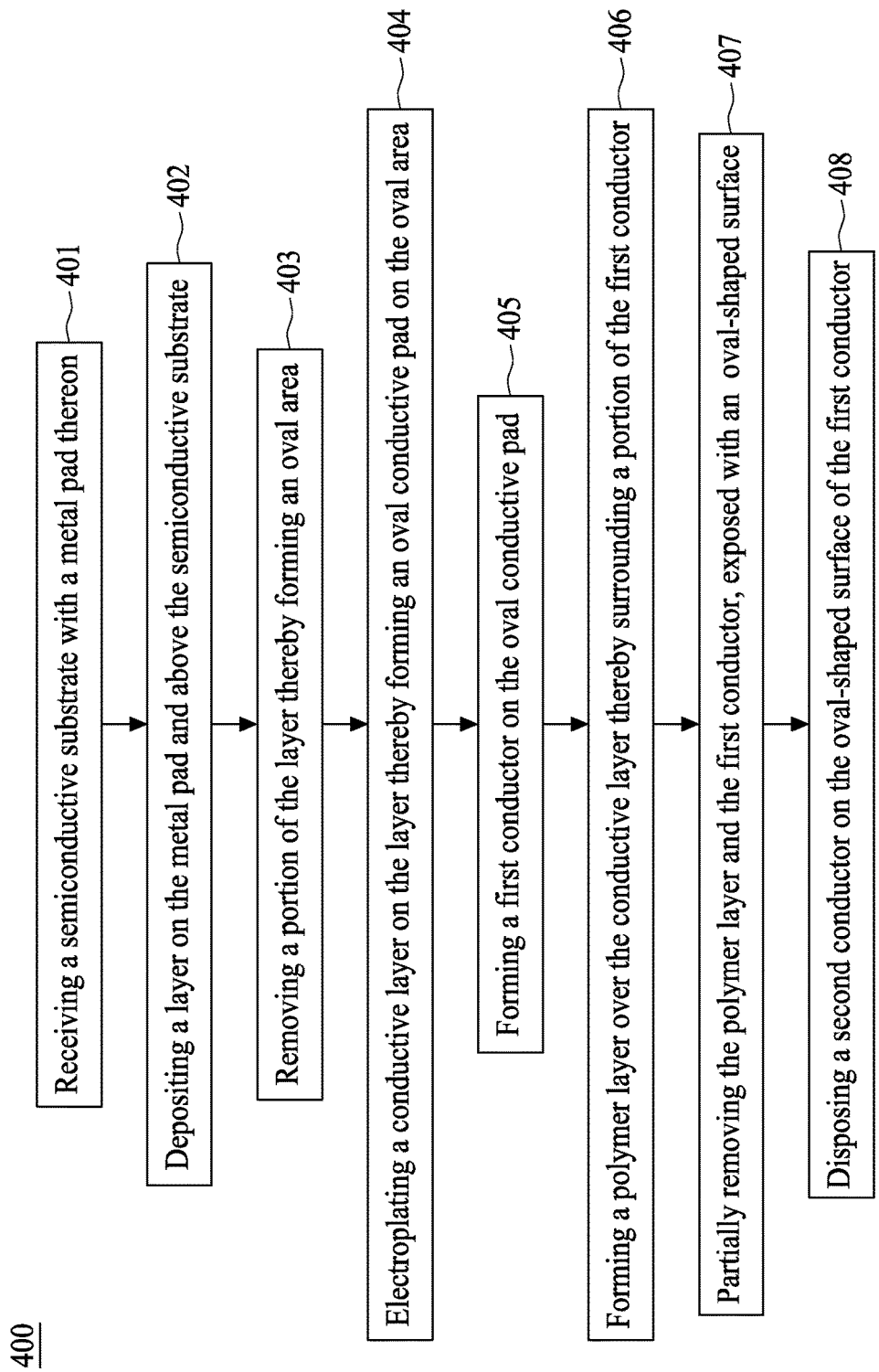
FIG. 29 is a flowchart of a method in manufacturing a semiconductor structure according to some embodiments of the present disclosure.

FIG. 29 is a diagram of a method 400 for manufacturing a semiconductor structure in accordance with some embodiments of the present disclosure. At operation 401, a semiconductive substrate with a metal pad thereon is received. At operation 402, a layer is deposited on the metal pad and above the semiconductive substrate. At operation 403, a portion of the layer is removed, thereby forming an oval area. At operation 404, a conductive layer is electroplated on the layer, thereby forming an oval conductive pad on the oval area. At operation 405, a first conductor is formed on the oval conductive pad. At operation 406, a polymer layer is formed over the conductive layer, thereby surrounding a portion of the first conductor. At operation 407, the polymer layer and the first conductor are partially removed so that an oval-shaped surface of the first conductor is exposed. At operation 408, a second conductor is disposed on the oval-shaped surface of the first conductor.

In some embodiments, a method for manufacturing a semiconductor structure includes receiving a semiconductive substrate with a post passivation interconnect (PPI) including an oval landing area. The method also includes forming a first conductor on the oval landing area. The method also includes forming a polymer layer above the semiconductive substrate, thereby surrounding a portion of the first conductor. The method also includes polishing the polymer layer and the first conductor in order to form a planarized surface. The method also includes forming a second conductor on the polished first conductor.

In some embodiments, a method for fabricating a semiconductor structure includes receiving a semiconductive substrate with a metal pad thereon. The method also includes depositing a layer on the metal pad and above the semiconductive substrate. The method also includes removing a portion of the layer, thereby forming an oval area. The method also includes electroplating a conductive layer on the layer, thereby forming an oval conductive pad on the oval area. The method also includes forming a first conductor on the oval conductive pad. The method also includes forming a polymer layer over the conductive layer, thereby surrounding a portion of the first conductor. The method also includes partially removing the polymer layer and the first conductor so that the first conductor is exposed with an oval-shaped surface. The method also includes disposing a second conductor on the oval-shaped surface of the first conductor.

In some embodiments, a method for fabricating a semiconductor structure is provided. The method comprises: receiving a semiconductive substrate; disposing a plurality of post passivation interconnects (PPIs) above the semiconductive substrate; disposing a polymer layer above the plurality of PPIs and the semiconductive substrate; and contacting a plurality of conductors with the plurality of PPIs respectively, the plurality of conductors partially surrounded by the polymer layer; wherein the semiconductive substrate has a geometric center, and a longest axis of each of the plurality of conductors is towards the geometric center of the semiconductor substrate.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing the claims.

Various operations of embodiments are provided herein. The order in which some or all of the operations are described should not be construed as to imply that these operations are necessarily order dependent. Alternative ordering will be appreciated by one skilled in the art having the benefit of this description. Further, it will be understood that not all operations are necessarily present in each embodiment provided herein. It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments.

Further, unless specified otherwise, "first," "second," or the like are not intended to imply a temporal aspect, a spatial aspect, an ordering, etc. Rather, such terms are merely used as identifiers, names, etc. for features, elements, items, etc. For example, a first channel and a second channel generally correspond to channel A and channel B or two different or two identical channels or the same channel.

As used in this application, "or" is intended to mean an inclusive "or" rather than an exclusive "or". In addition, "a" and "an" as used in this application are generally to be construed to mean "one or more" unless specified otherwise or clear from context to be directed to a singular form. Furthermore, to the extent that "includes", "having", "has", "with", or variants thereof are used in either the detailed description or the claims, such terms are intended to be inclusive in a manner similar to "comprising".

What is claimed is:

1. A method for manufacturing a semiconductor structure, comprising:
    forming a conductive layer and etching the conductive layer to have an oval area on a semiconductive substrate;
    forming a post passivation interconnect (PPI) including an oval landing area on the oval area of the conductive layer;
    forming a first conductor on the oval landing area to form an oval-shape conductor;
    forming a polymer layer above the semiconductive substrate and the PPI to surround an outer surface of the oval-shape conductor;

polishing the polymer layer and the oval-shape conductor in order to form a planarized surface and expose a polished surface of the oval-shaped conductor; and forming a second conductor on the polished surface of the oval-shape conductor.

2. The method of claim 1, further comprising planarizing the top surface of the oval-shape conductor.

3. The method of claim 1, wherein polishing the polymer layer and the oval-shape conductor further comprises applying a diamond disk on the polymer layer and the oval-shape conductor.

4. The method of claim 1, wherein receiving the semiconductive substrate comprises chucking the semiconductive substrate on a stage.

5. The method of claim 1, further comprising measuring a thickness of the polymer layer or the oval-shape conductor after polishing the polymer layer and the first conductor.

6. The method of claim 1, wherein the oval area of the conductive layer includes an oval portion connected to a second portion via a trace portion on a semiconductive substrate;

the oval landing area of the PPI includes an oval landing portion connected to a second portion via a trace portion formed on the corresponding oval portion, second portion and trace portion, respectively, of the conductive layer; and the step of forming the first conductor on the oval landing area includes forming the first conductor on the oval landing portion to form the oval-shape conductor.

7. The method of claim 1, wherein polishing the polymer layer and the oval-shape conductor further comprises applying a slurry on the polymer layer and the oval-shape conductor.

8. A method for manufacturing a semiconductor structure, comprising:

receiving a semiconductive substrate with a metal pad thereon;

depositing a layer on the metal pad and above the semiconductive substrate;

removing a portion of the layer, thereby forming an oval area;

electroplating a conductive layer on the layer, thereby forming an oval conductive pad on the oval area;

forming a first conductor on the oval conductive pad;

forming a polymer layer over the conductive layer, thereby surrounding a portion of the first conductor;

partially removing the polymer layer and the first conductor, wherein the first conductor is exposed with an oval-shaped surface; and disposing a second conductor on the oval-shaped surface of the first conductor.

9. The method of claim 8, further comprising reflowing the second conductor to form a turning point at an intersection between the first and second conductors.

10. The method of claim 8, further comprising connecting the second conductor to a printed circuit board (PCB).

11. The method of claim 8, further comprising applying a slurry on the polymer layer and the first conductor while partially removing the polymer layer and the first conductor.

12. A method for manufacturing a semiconductor structure, comprising:

receiving a semiconductive substrate;

forming a plurality of patterned conductive layers having a plurality of oval areas on the semiconductive substrate respectively;

disposing a plurality of post passivation interconnects (PPIs) having a plurality of oval conductive pads on the plurality of oval areas of the plurality of patterned conductive layers respectively;

disposing a polymer layer above the plurality of PPIs and the semiconductive substrate; and contacting a plurality of conductors with the plurality of PPIs to form a plurality of oval-shape conductors respectively, wherein each of the plurality of oval-shape conductors has a first oval-shape portion and a second oval-shape portion, the first oval-shape is surrounded by the polymer layer, and the second oval-shape portion is protruded from the polymer layer;

wherein the semiconductive substrate has a geometric center, and a longest axis of each of the plurality of oval-shape conductors is towards the geometric center of the semiconductor substrate.

13. The method of claim 12, further comprising:

depositing a conductive layer on the semiconductive substrate;

removing a portion of the conductive layer, thereby forming the plurality of patterned conductive layers;

electroplating the plurality of PPIs on the plurality of patterned conductive layers respectively.

14. The method of claim 13, further comprising:

forming the plurality of oval conductive pads on the plurality of oval areas of the plurality of patterned conductive layers respectively.

15. The method of claim 12, wherein disposing the plurality of PPIs above the semiconductive substrate comprises:

disposing a conductive layer on the semiconductive substrate;

etching a portion of the conductive layer to form the plurality of PPIs.

16. The method of claim 15, wherein disposing the plurality of PPIs above the semiconductive substrate further comprises:

forming a plurality of oval conductive pads on the plurality of PPIs respectively.

17. The method of claim 12, wherein each of the plurality of oval-shape conductors has a shortest axis, and the shortest axis is perpendicular to the longest axis.

18. The method of claim 12, wherein a top surface of the first oval-shape portion and a top surface of the polymer layer are coplanar.

19. The method of claim 12, wherein the plurality of oval-shape conductors is placed at a peripheral region of the semiconductor structure.

20. The method of claim 12, wherein the plurality of the first oval-shape portions are coplanar with the polymer layer, and the plurality of the second oval-shape portions are protruded from the polymer layer.

* * * * *